US006995060B2

(12) United States Patent
Ding

(10) Patent No.: US 6,995,060 B2
(45) Date of Patent: Feb. 7, 2006

(54) FABRICATION OF INTEGRATED CIRCUIT ELEMENTS IN STRUCTURES WITH PROTRUDING FEATURES

(75) Inventor: Yi Ding, Sunnyvale, CA (US)

(73) Assignee: ProMOS Technologies Inc., Hsin Chu (TW)

( * ) Notice: Subject to any disclaimer, the term of this patent is extended or adjusted under 35 U.S.C. 154(b) by 287 days.

(21) Appl. No.: 10/393,202

(22) Filed: Mar. 19, 2003

(65) Prior Publication Data

US 2004/0185614 A1 Sep. 23, 2004

(51) Int. Cl.
H01L 21/8247 (2006.01)
(52) U.S. Cl. ...................................... 438/257; 438/975
(58) Field of Classification Search ......... 438/257–267
See application file for complete search history.

(56) References Cited

U.S. PATENT DOCUMENTS

| | | | |
|---|---|---|---|
| 4,701,776 A | 10/1987 | Perlegos et al. | |
| 5,402,371 A | 3/1995 | Ono | |
| 5,408,115 A | 4/1995 | Chang | |
| 5,424,979 A | 6/1995 | Morii | |
| 5,445,983 A | 8/1995 | Hong | |
| 5,633,185 A | 5/1997 | Yiu et al. | |
| 5,668,757 A | 9/1997 | Jeng | |
| 5,705,415 A | 1/1998 | Orlowski et al. | |
| 5,821,143 A | 10/1998 | Kim et al. | |
| 5,856,943 A | 1/1999 | Jeng | |
| 5,901,084 A | 5/1999 | Ohnakado | |
| 5,910,912 A | 6/1999 | Hsu et al. | |
| 5,912,843 A | 6/1999 | Jeng | |
| 5,918,124 A | 6/1999 | Sung | |
| 6,040,216 A | 3/2000 | Sung | |
| 6,057,575 A | 5/2000 | Jenq | |
| 6,107,141 A | 8/2000 | Hsu et al. | |
| 6,130,129 A | 10/2000 | Chen | |
| 6,133,098 A | 10/2000 | Ogura et al. | |
| 6,134,144 A | 10/2000 | Lin et al. | |
| 6,162,682 A | 12/2000 | Kleine | |
| 6,171,909 B1 * | 1/2001 | Ding et al. | 438/267 |
| 6,187,636 B1 | 2/2001 | Jeong | |
| 6,200,856 B1 | 3/2001 | Chen | |

(Continued)

FOREIGN PATENT DOCUMENTS

EP 0 938 098 A2 8/1999

OTHER PUBLICATIONS

Naruke, K.; Yamada, S.; Obi, E.; Taguchi, S.; and Wada, M. "A New Flash-Erase EEPROM Cell with A Sidewall Select-Gate On Its Source Side," 1989 IEEE, pp. 604-606.

(Continued)

Primary Examiner—Richard A. Booth
(74) Attorney, Agent, or Firm—Michael Shenker; MacPherson Kwok Chen & Heid LLP

(57) ABSTRACT

A structure is obtained having a semiconductor substrate, the structure having an upward protruding feature (140). A first layer (160) is formed on the structure. The first layer (160) has a first portion (170.1) protruding upward over the protruding feature (140). Then a second layer (1710) is formed over the first layer (160) such that the first portion (170.1) is exposed and not completely covered by the second layer (1710). The first layer (160) is partially removed selectively to the second layer to form a cavity (1810) at the location of the first feature (140). A third layer (1910) is formed in the cavity. Then at least parts of the second layer (1710) and the first layer (160) are removed selectively to the third layer (1910). In some embodiments, self-aligned features are formed from the first layer (160) over the sidewalls of the first features (140) as a result.

7 Claims, 38 Drawing Sheets

U.S. PATENT DOCUMENTS

| | | | |
|---|---|---|---|
| 6,214,669 | B1 | 4/2001 | Hisamune |
| 6,218,689 | B1 | 4/2001 | Chang et al. |
| 6,228,695 | B1 | 5/2001 | Hsieh et al. |
| 6,232,185 | B1 | 5/2001 | Wang |
| 6,261,856 | B1 | 7/2001 | Shinohara et al. |
| 6,265,739 | B1 | 7/2001 | Yaegashi et al. |
| 6,266,278 | B1 | 7/2001 | Harari et al. |
| 6,294,297 | B1 | 9/2001 | Chen |
| 6,326,661 | B1 | 12/2001 | Dormans et al. |
| 6,011,725 | A1 | 1/2002 | Eitan |
| 6,344,993 | B1 | 2/2002 | Harari et al. |
| 6,355,524 | B1 | 3/2002 | Tuan et al. |
| 6,365,457 | B1 | 4/2002 | Choi |
| 6,388,293 | B1 | 5/2002 | Ogura et al. |
| 6,414,872 | B1 | 7/2002 | Bergemont et al. |
| 6,420,231 | B1 | 7/2002 | Harari et al. |
| 6,436,764 | B1 | 8/2002 | Hsieh |
| 6,437,360 | B1 | 8/2002 | Cho et al. |
| 6,438,036 | B2 | 8/2002 | Seki et al. |
| 6,468,865 | B1 | 10/2002 | Yang et al. |
| 6,486,023 | B1 | 11/2002 | Nagata |
| 6,518,618 | B1 | 2/2003 | Fazio et al. |
| 6,541,324 | B1 | 4/2003 | Wang |
| 6,541,829 | B2 | 4/2003 | Nishinohara et al. |
| 6,566,196 | B1 | 5/2003 | Haselden et al. |
| 6,635,533 | B1 | 10/2003 | Chang et al. |
| 6,642,103 | B2 | 11/2003 | Wils et al. |
| 6,660,589 | B2 | 12/2003 | Park |
| 6,696,340 | B2 | 2/2004 | Furuhata |
| 6,747,310 | B2 | 6/2004 | Fan et al. |
| 6,764,905 | B2 | 7/2004 | Jeng et al. |
| 6,803,276 | B2 | 10/2004 | Kim et al. |
| 2002/0064071 | A1 | 5/2002 | Takahashi et al. |
| 2002/0197888 | A1 | 12/2002 | Huang et al. |
| 2003/0205776 | A1 | 11/2003 | Yaegashi et al. |
| 2003/0218908 | A1 | 11/2003 | Park et al. |
| 2004/0004863 | A1 | 1/2004 | Wang |

OTHER PUBLICATIONS

Wu, A.T.; Chan T.Y.; Ko, P.K.; and Hu, C. "A Novel High-Speed, 5-Volt Programming EPROM Structure With Source-Side Injection," 1986 IEEE, 584-587.

Mizutani, Yoshihisa; and Makita, Koji "A New EPROM Cell With A Sidewall Floating Gate Fro High-Density and High Performance Device," 1985 IEEE, 635-638.

Ma, Y.; Pang, C.S.; Pathak, J.; Tsao, S.C.; Chang, C.F.; Yamauchi, Y.; Yoshimi, M. "A Novel High Density Contactless Flash Memory Array Using Split-Gate Source-Side-Injection Cell for 5V-Only Applications," 1994 Symposium on VLSI Technology Digest of Technical Papers, pp. 49-50.

Mih, Rebecca et al. "0.18um Modular Triple Self-Aligned Embedded Split-Gate Flash Memory," 2000 Symposium on VLSI Technology Digest of Technical Papers, pp. 120-121.

Shirota, Riichiro "A Review of 256Mbit NAND Flash Memories and NAND Flash Future Trend," Feb. 2000, Nonvolatile Memory Workshop in Monterey, California, pp. 22-31.

U.S. Appl. No. 10/393,212, filed on Mar. 19, 2003 entitled "Nonvolatile Memories And Methods of Fabrication,".

U.S. Appl. No. 10/411,813, filed on Apr. 10, 2003, entitled "Nonvolatile Memories With A Floating Gate Having an Upward Protrusion,".

Ma, Yale et al., "A Dual-Bit Split-Gate EEPROM (DS'G) Cell in Contactless Array for Single Vcc High Density Flash Memories," 1994 IEEE, 3.5.1-3.5.4.

Spinelli, Alessandro S., "Quantum-Mechanical 2D Simulation of Surface-and Buried-Channel p-MOS," 2000 International Conference on Simulation of Semiconductor Processes and Devices: SISPAD 2000, Seattle, WA Sep. 6-8, 2000.

Kim, K.S. et al. "A Novel Dual String NOR (DuSnor) Memory Cell Technology Scalable to the 256 Mbit and 1 Gbit Flash Memories," 1995 IEEE 11.1.1-11.1.4.

Bergemont, A. et al. "NOR Virtual Ground (NVG)- A New Scaling Concept for Very High Density FLAS EEPROM and its Implementation in a 0.5 um Process," 1993 IEEE 2.2.1-2.2.4.

Van Duuren, Michiel et al., "Compact poly-CMP Embedded Flash Memory Cells For One or Two Bit Storage," Philips Research Leuven, Kapeldreef 75, B3001 Leuven, Belgium, pp. 73-74.

U.S. Appl. No. 10/440,466, entitled "Fabrication Of Conductive Gates For Nonvolatile Memories From Layers With Protruding Portions," Filed on May 16, 2003.

U.S. Appl. No. 10/440,005, entitled "Fabrication of Dielectric On A Gate Surface To Insulate The Gate From Another Element Of An Integrated Circuit," Filed on May 16, 2003.

U.S. Appl. No. 10/440,508, entitled "Fabrication of Gate Dielectric In Nonvolatile Memories Having Select, Floating And Control Gates," Filed on May 16, 2003.

U.S. Appl. No. 10/440,500, entitled "Integrated Circuits With Openings that Allow Electrical Contact To Conductive Features Having Self-Aligned Edges," Filed on May 16, 2003.

U.S. Appl. No. 10/393,212, entitled "Nonvolatile Memories And Methods Of Fabrication," Filed on Mar. 19, 2003.

U.S. Appl. No. 10/411,813, entitled "Nonvolatile Memories With A Floating Gate Having An Upward Protrusion," Filed on Apr. 10, 2003.

U.S. Appl. No. 10/631,941, entitled "Nonvolatile Memory Cell With Multiple Floating Gates Formed After The Select Gate," Filed on Jul. 30, 2003.

U.S. Appl. No. 10/632,155, entitled "Nonvolatile Memory Cells With Buried Channel Transistors," Filed on Jul. 30, 2004.

U.S. Appl. No. 10/632,007, entitled "Arrays Of Nonovolatile Memory Cells Wherein Each Cell Has Two Conductive Floating Gates," Filed on Jul. 30, 2003.

U.S. Appl. No. 10/631,452, entitled "Fabrication Of Dielectric For A Nonvolatile Memory Cell Having Multiple Floating Gates," Filed on Jul. 30, 2003.

U.S. Appl. No. 10/632,154, entitled "Fabrication Of Gate Dielectric In Nonvolatile Memories In Which A Memory Cell Has Multiple Floating Gates," Filed on Jul. 30, 2003.

U.S. Appl. No. 10/631,552, entitled "Nonvolatile Memories And Methods Of Fabrication," Filed on Jul. 30, 2003.

U.S. Appl. No. 10/632,186, entitled "Nonvolatile Memory Cell With Multiple Floating Gates Formed After The Select Gate and Having Upward Protrusions," Filed on Jul. 30, 2003.

U.S. Appl. No. 10/798,475, entitled "Fabrication of Conductive Lines Interconnecting Conductive Gates in Nonvolatile Memories and Non-Volatile Memory Structures," Filed on Mar. 10, 2004.

U.S. Appl. No. 10/797,972, entitled "Fabrication of Conductive Lines Interconnecting First Conductive Gates in Nonvolatile Memories Having Second Conductive Gates Provided By Conductive Gates Lines, Wherein The Adjacent Conductive Gate Lines For The Adjacent Columns Are Spaced From Each Other, And Non-Volatile Memory Structures," Filed on Mar. 10, 2004.

* cited by examiner

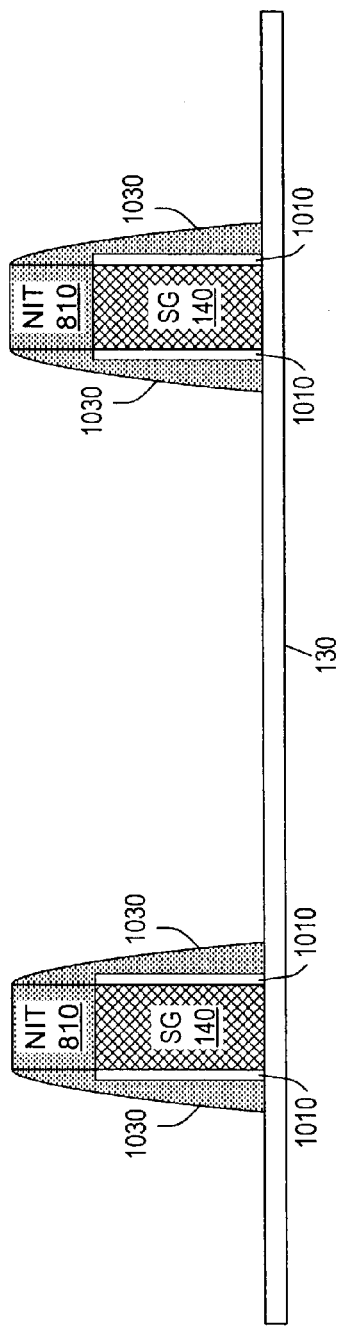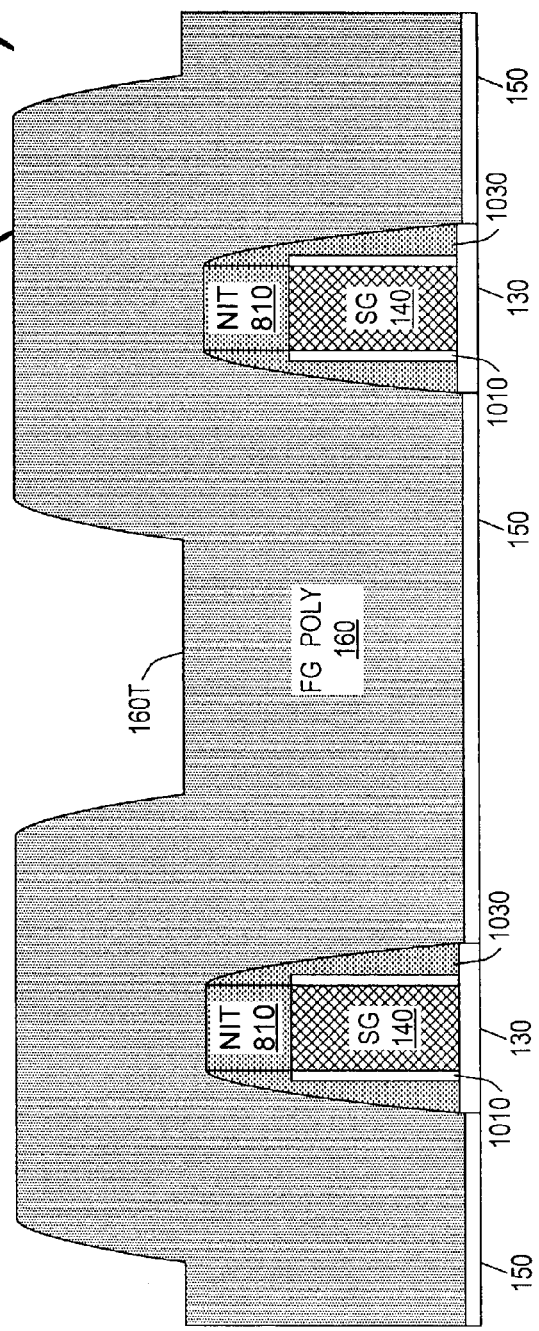

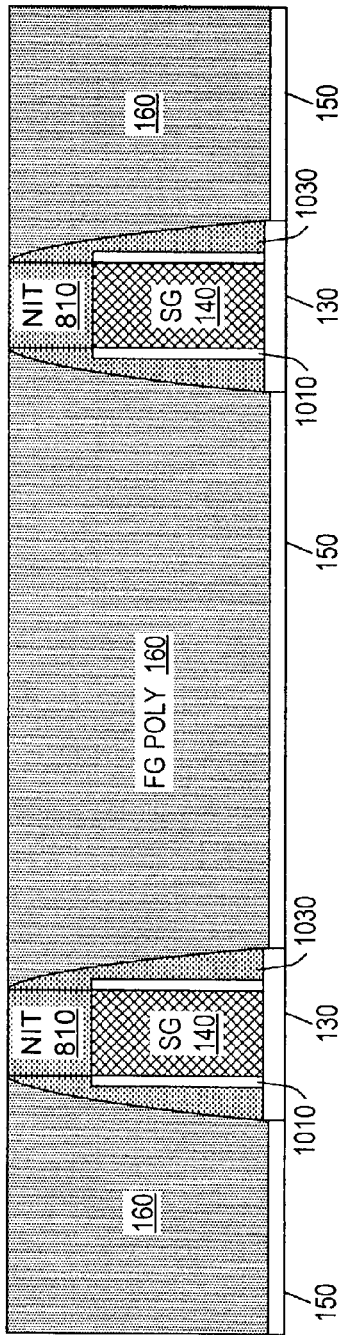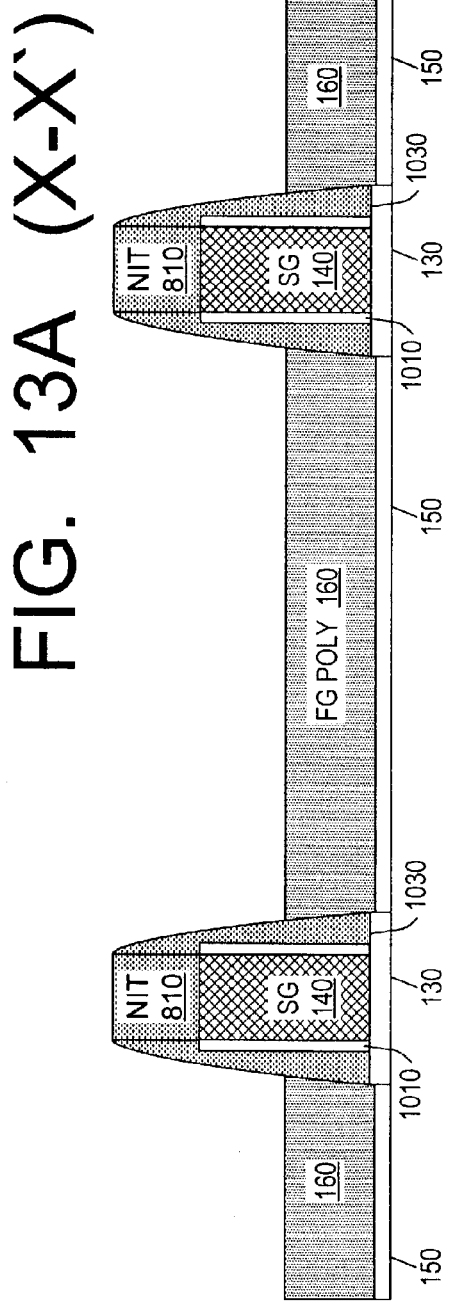

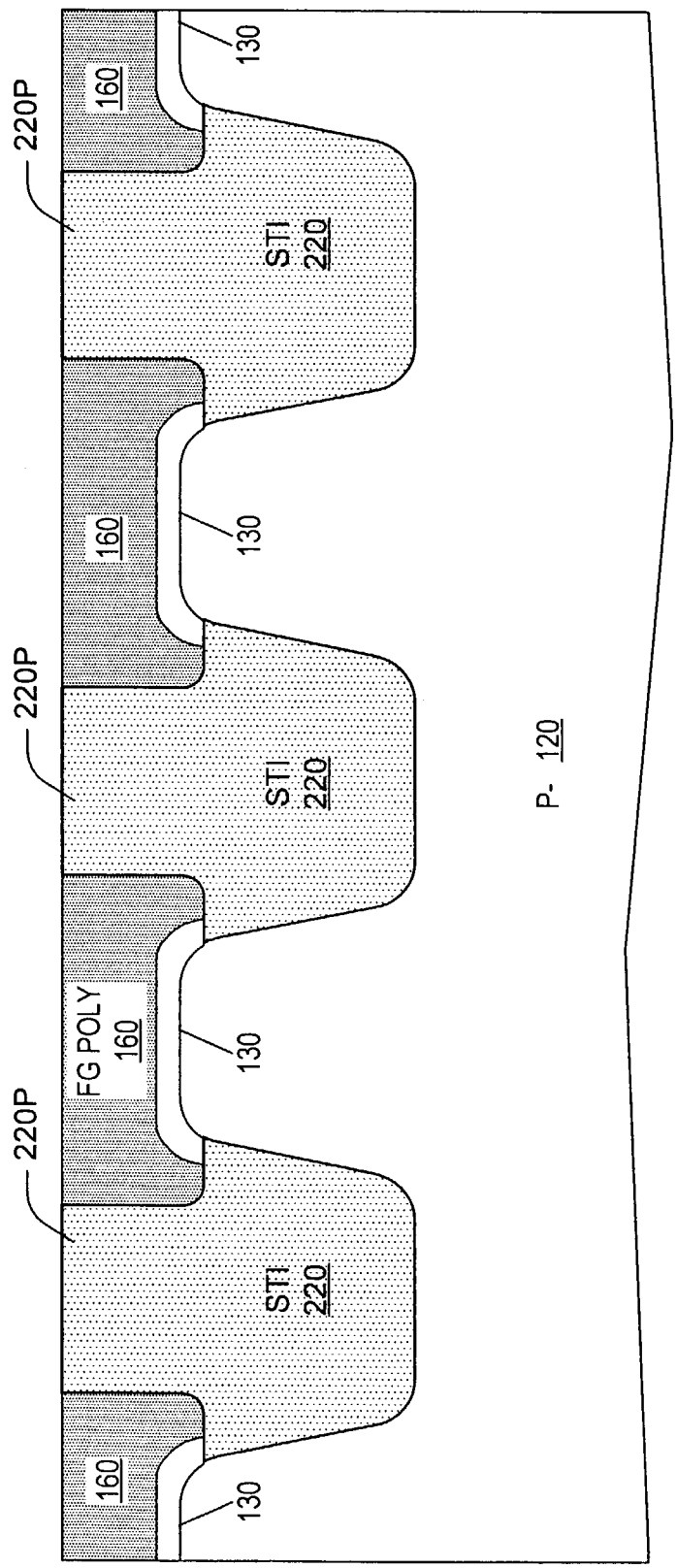
FIG. 13B (Y2-Y2')

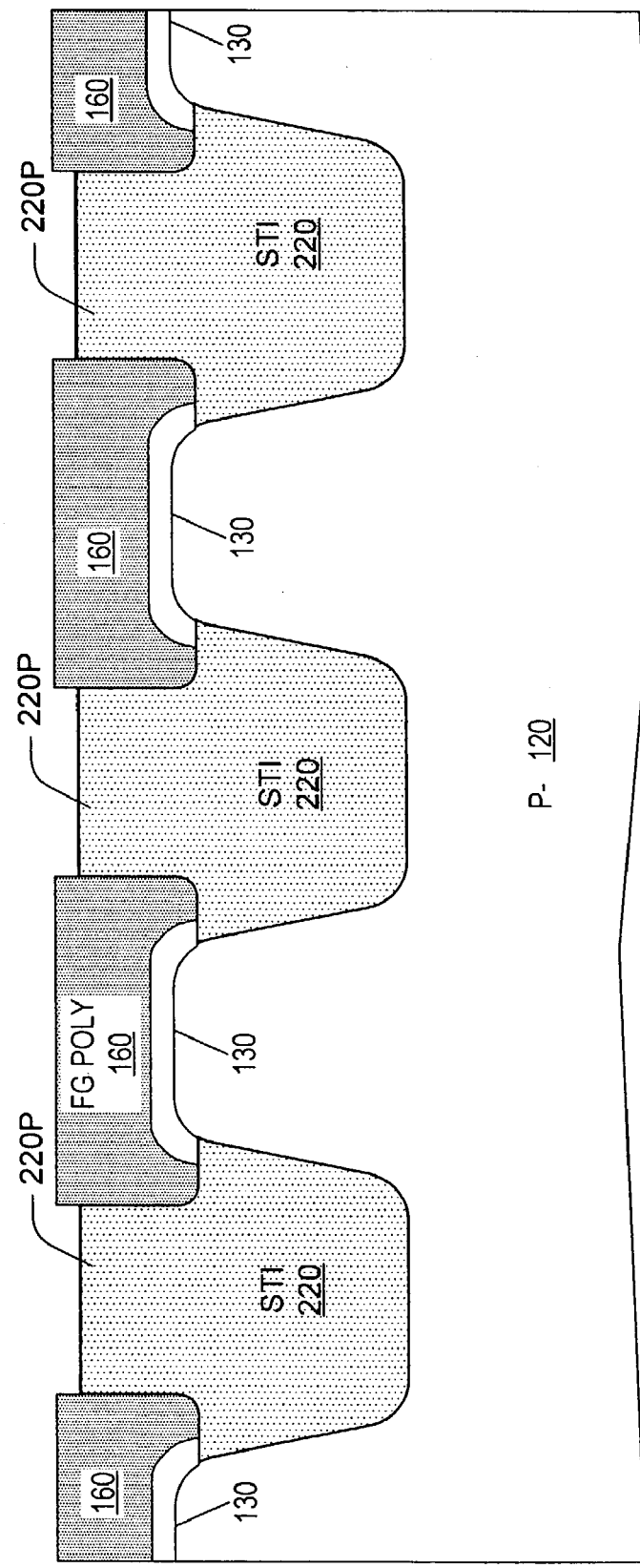
FIG. 14 (Y2-Y2')

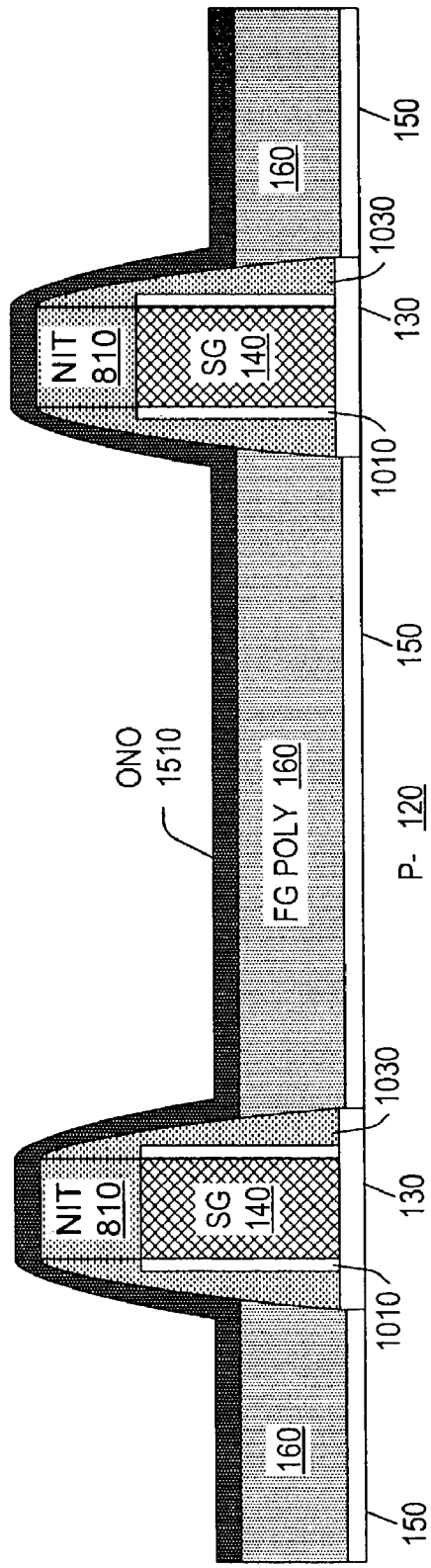
FIG. 15 (X-X')

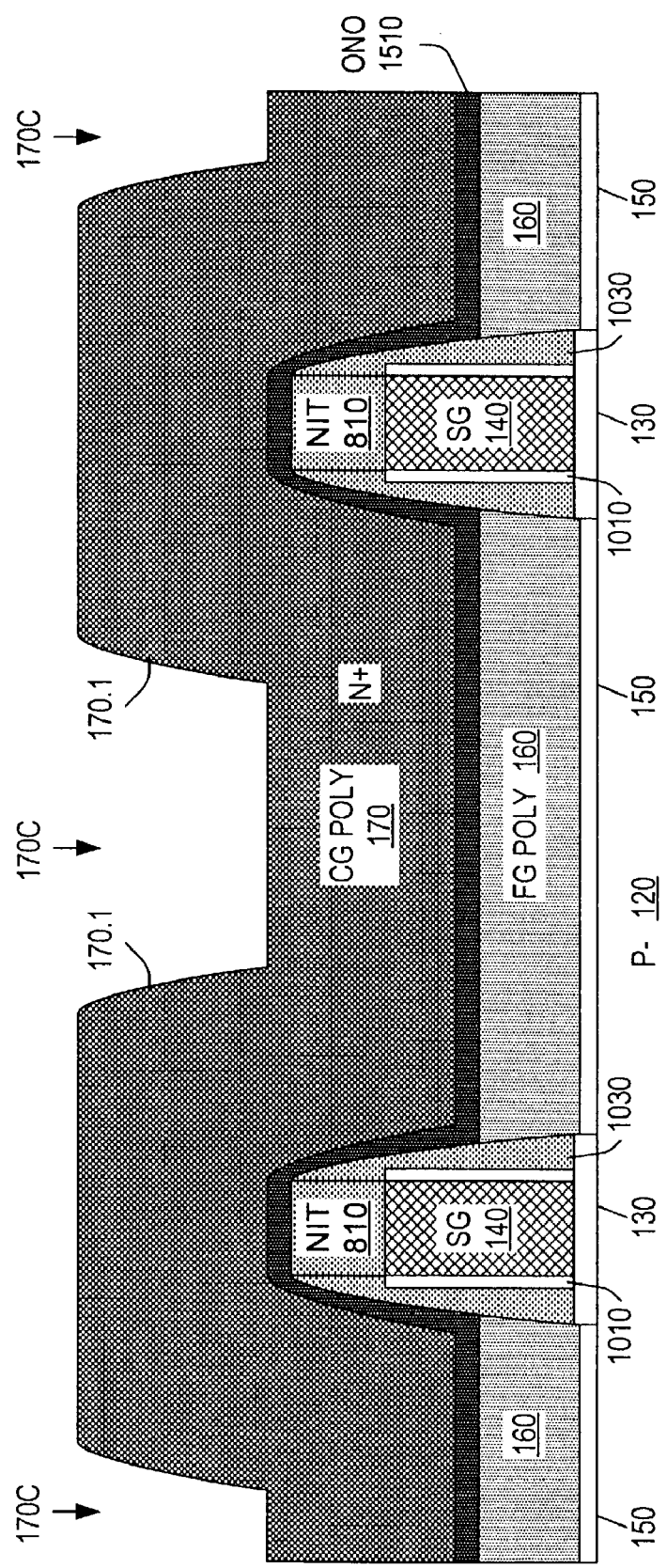
FIG. 16 (X-X')

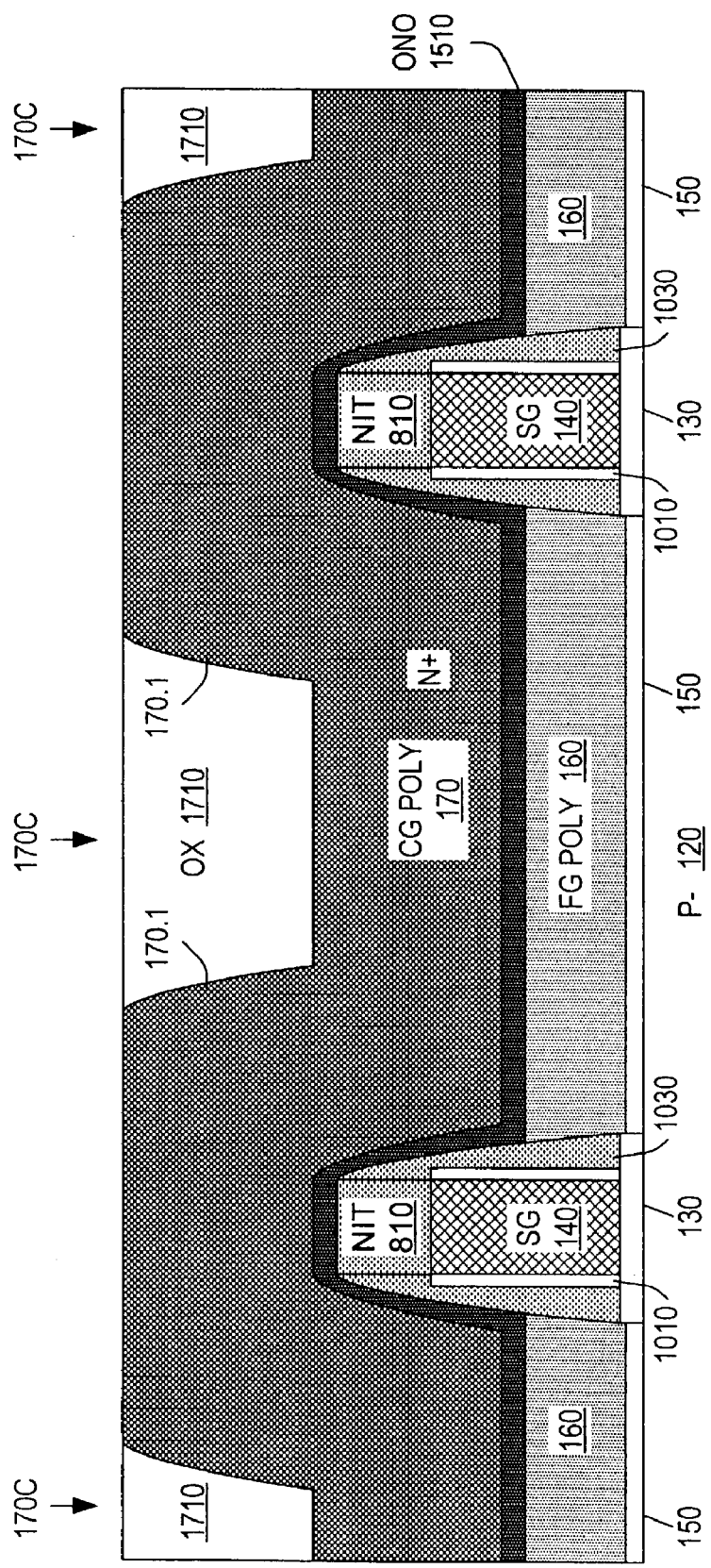
FIG. 17 (X-X')

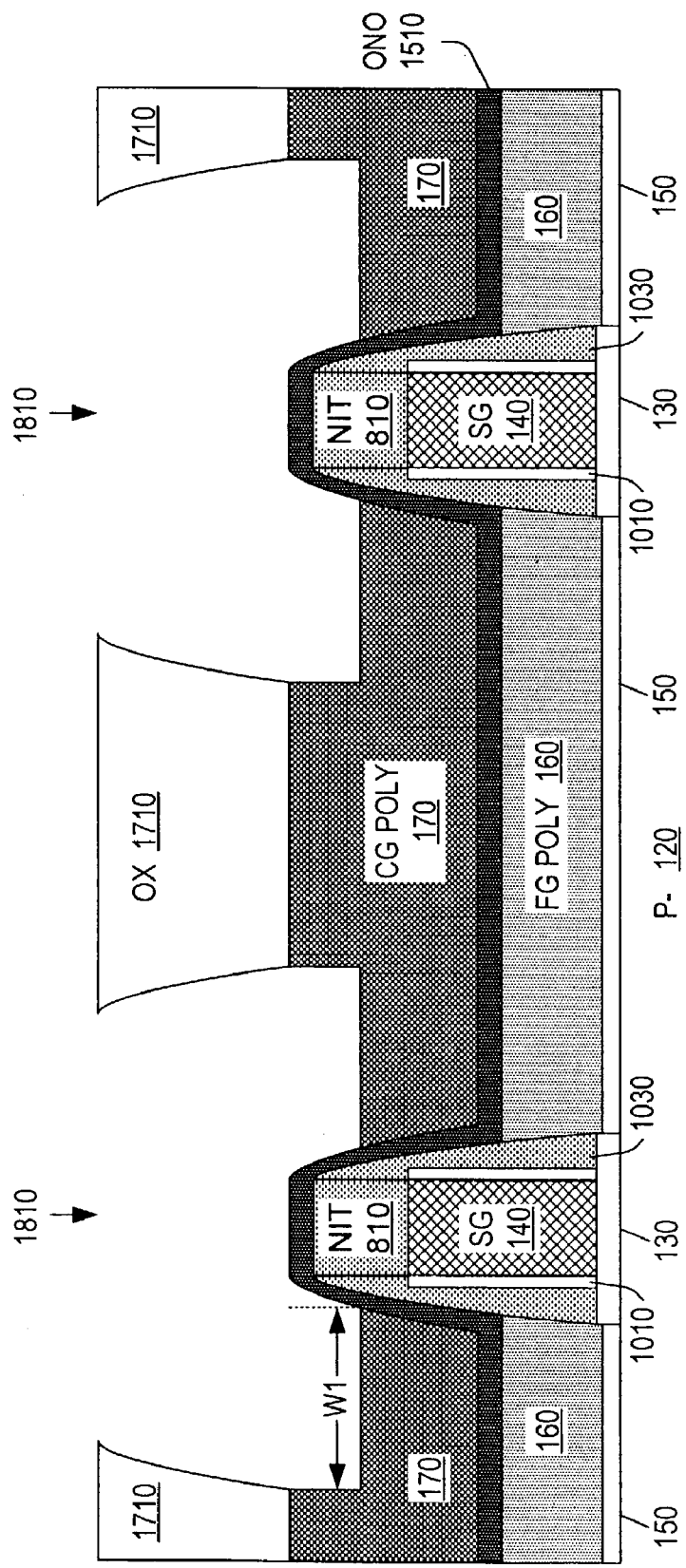
FIG. 18 (X-X')

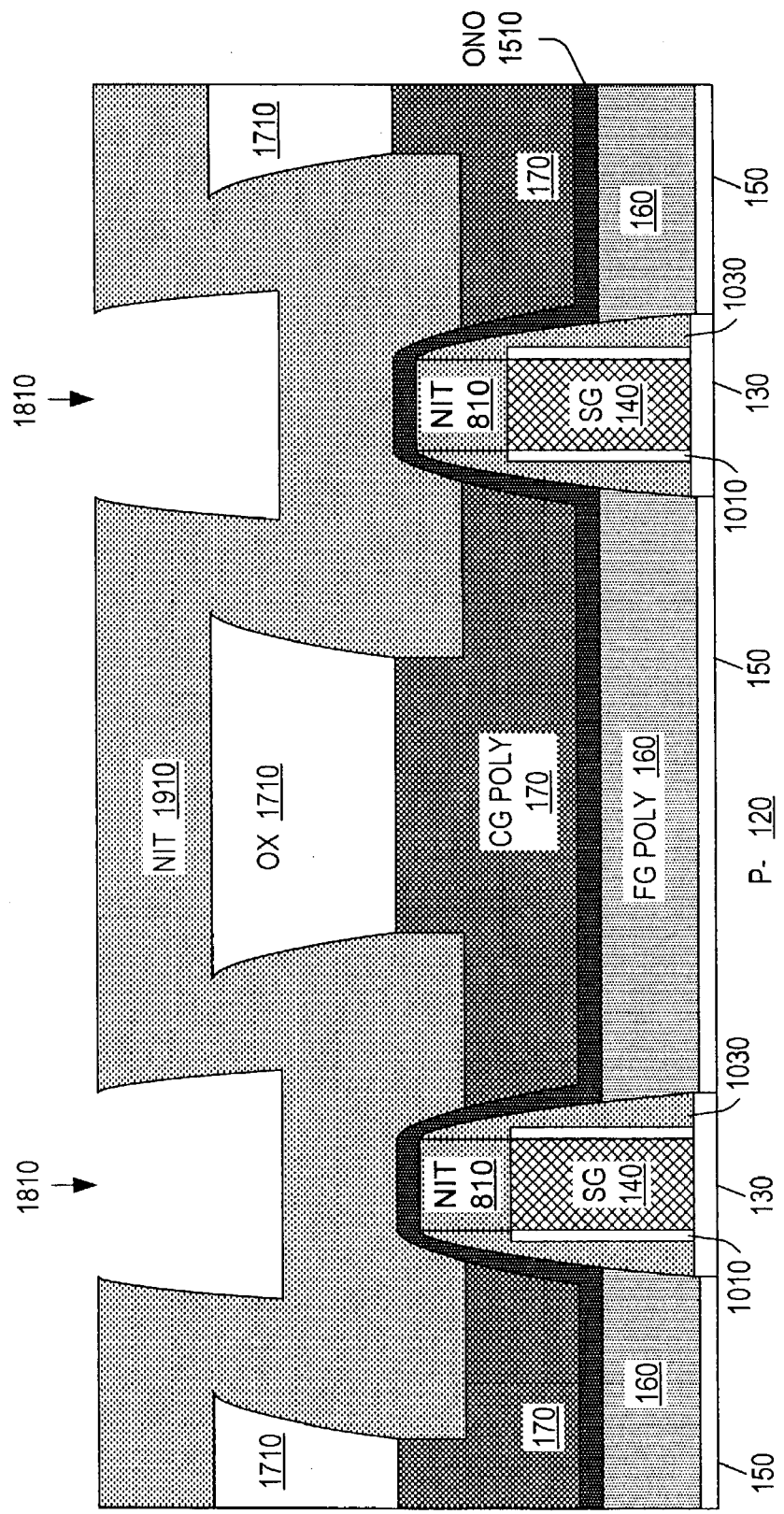
FIG. 19 (X-X')

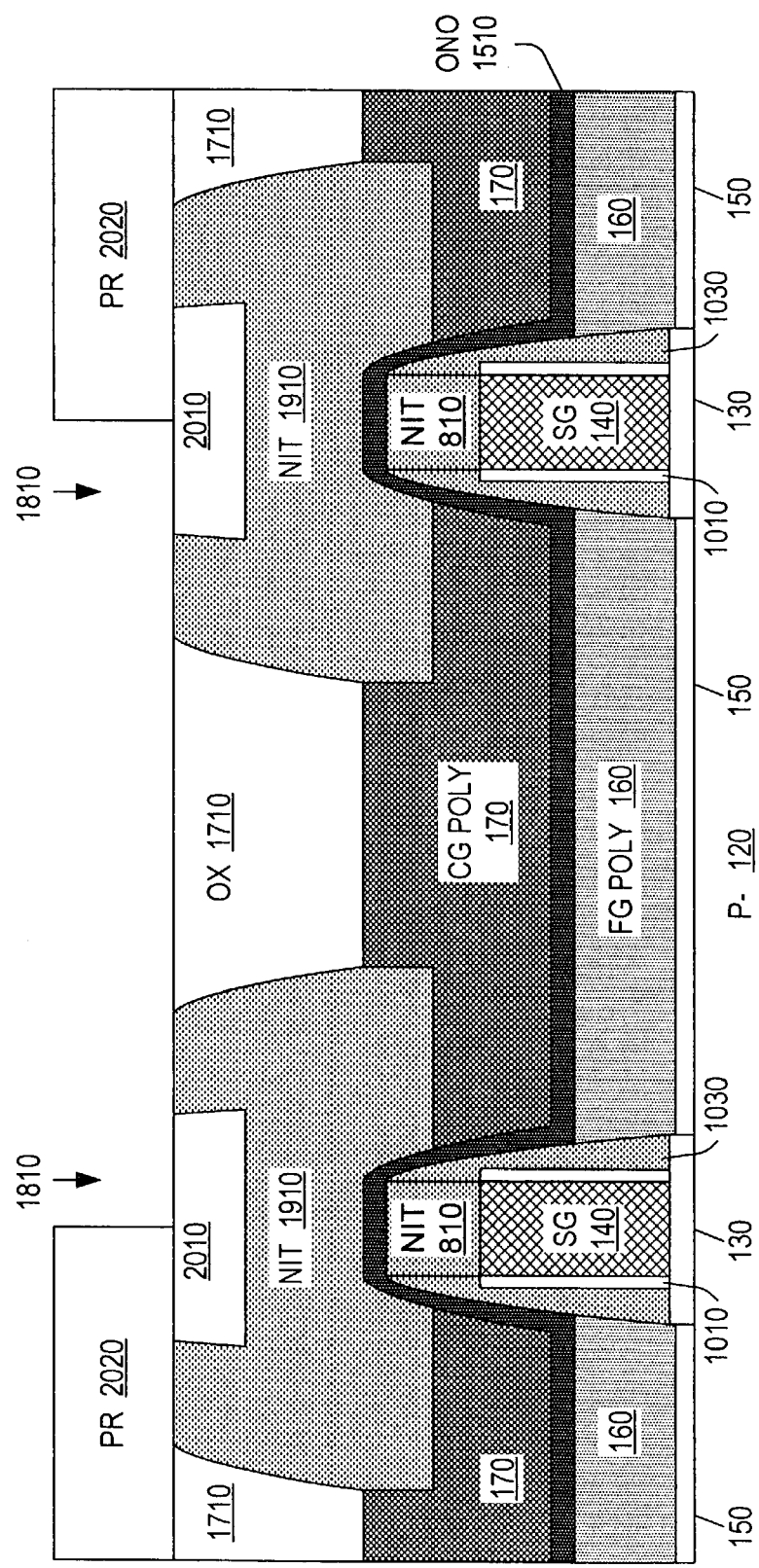
FIG. 20A (X-X')

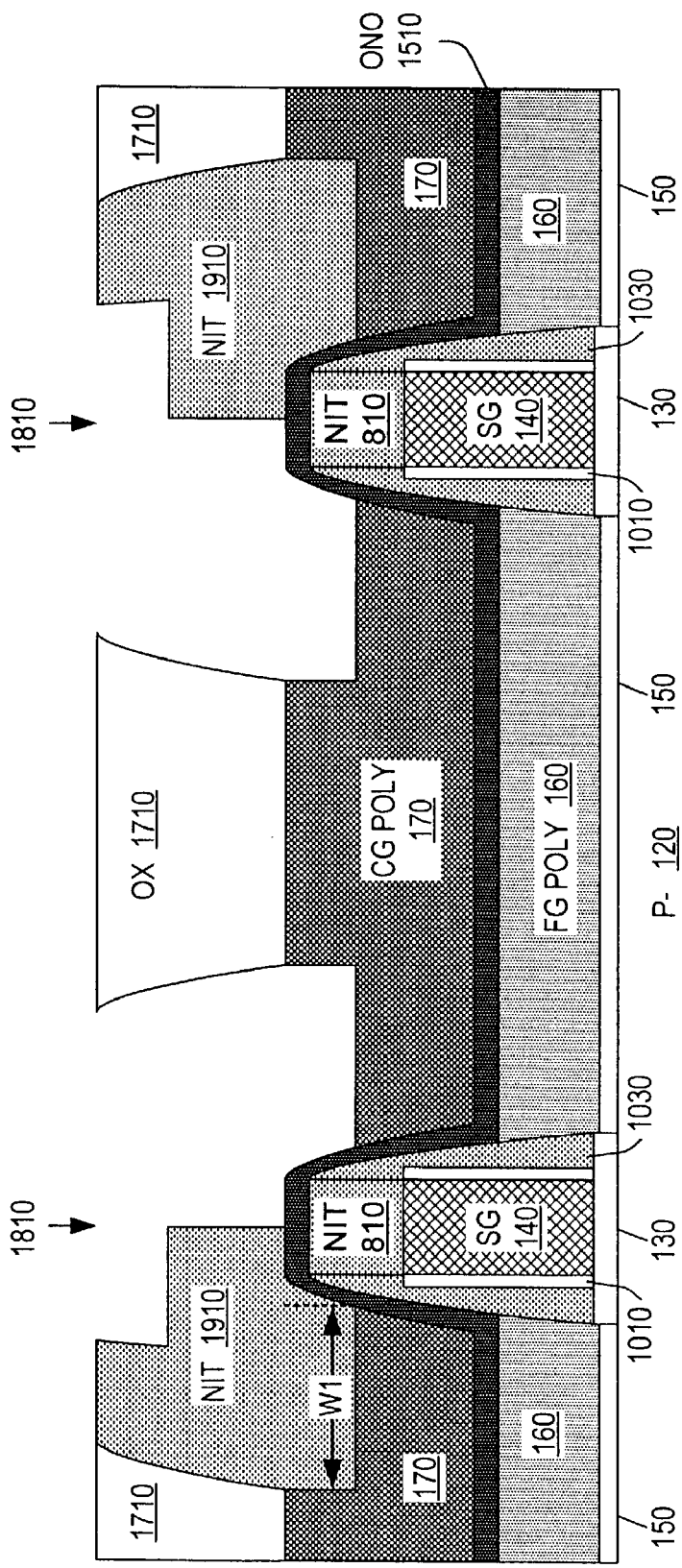
FIG. 21 (X-X')

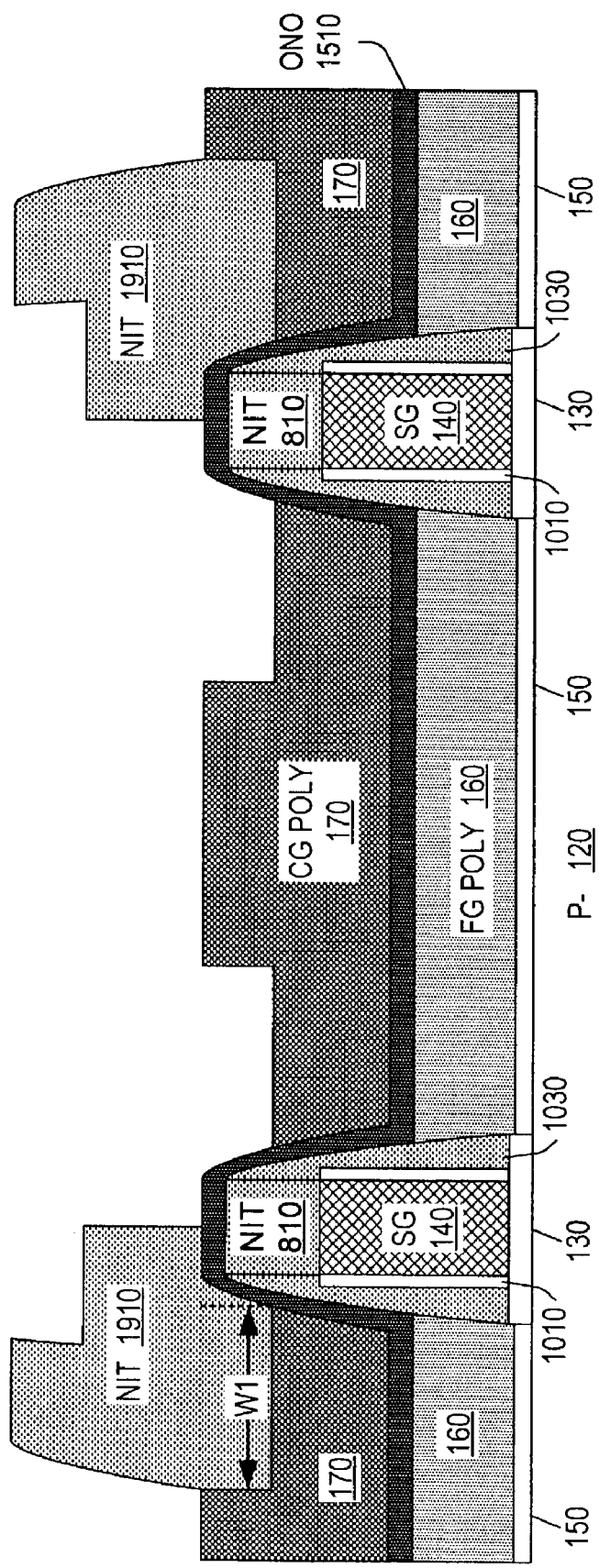
FIG. 22 (X-X')

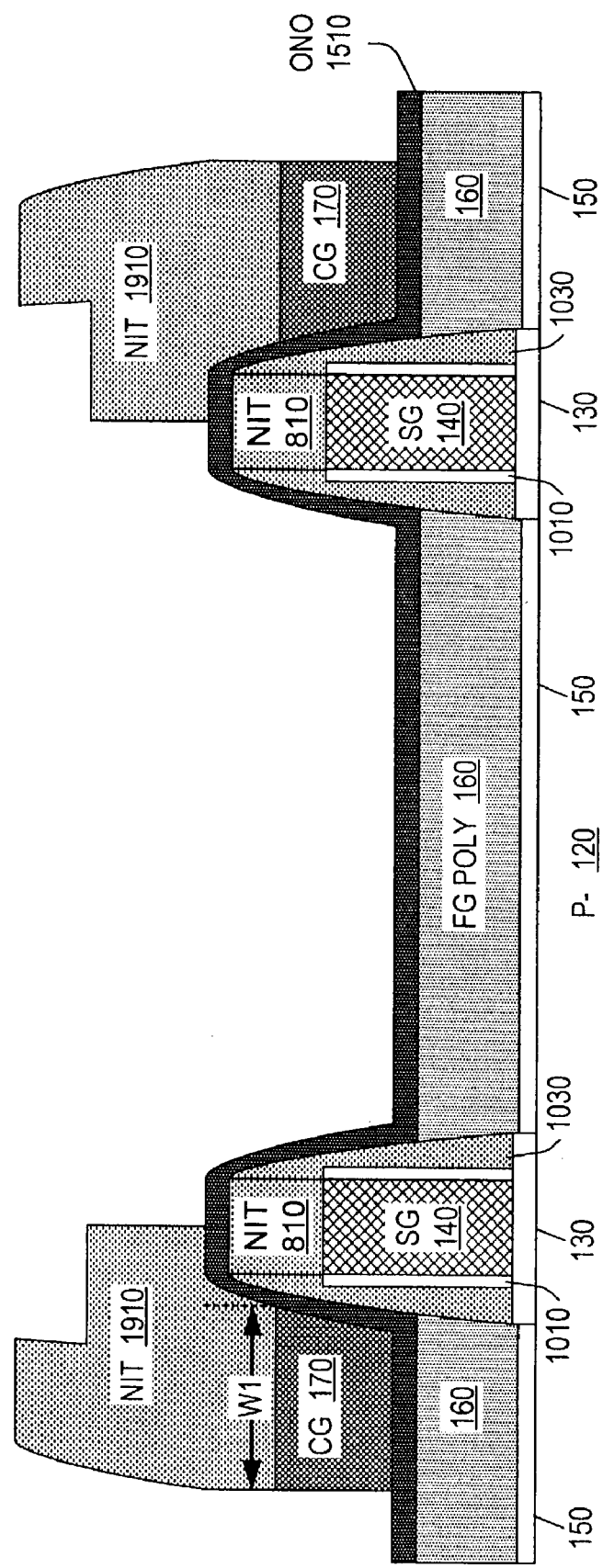
FIG. 23 (X-X')

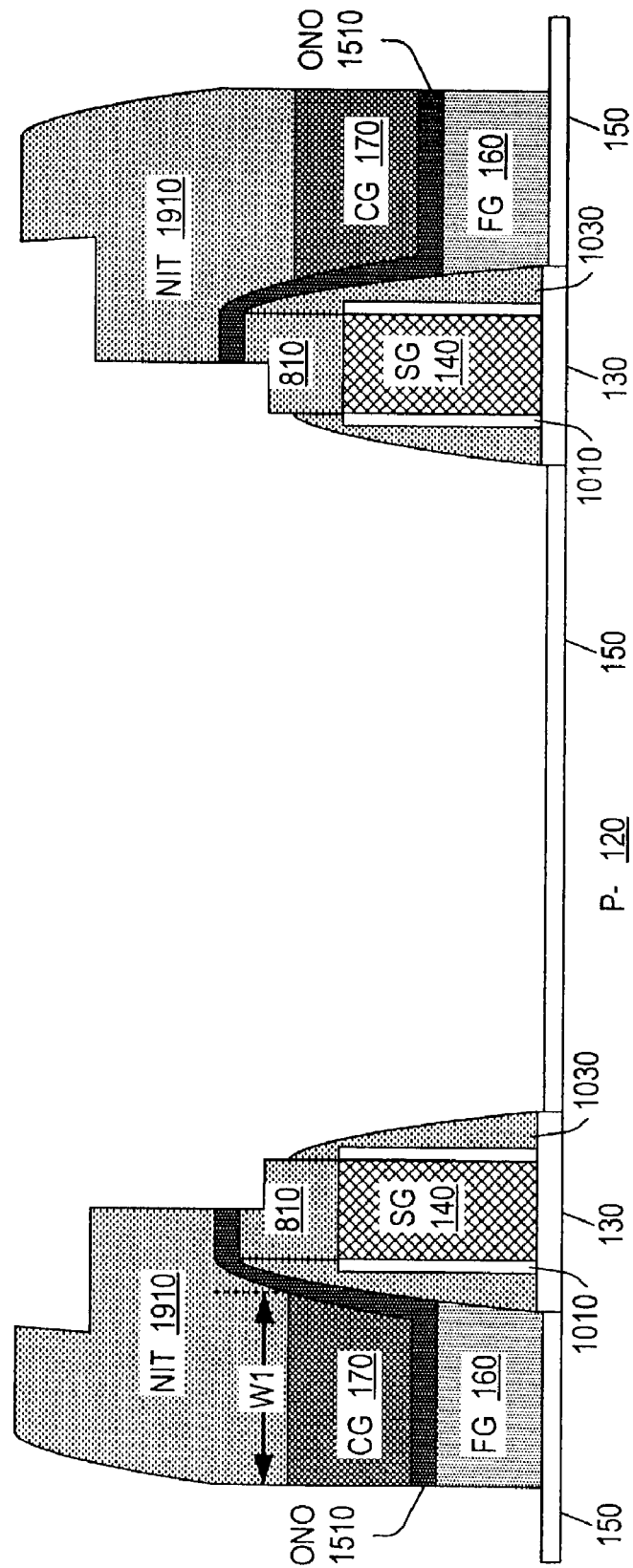
FIG. 24 (X-X')

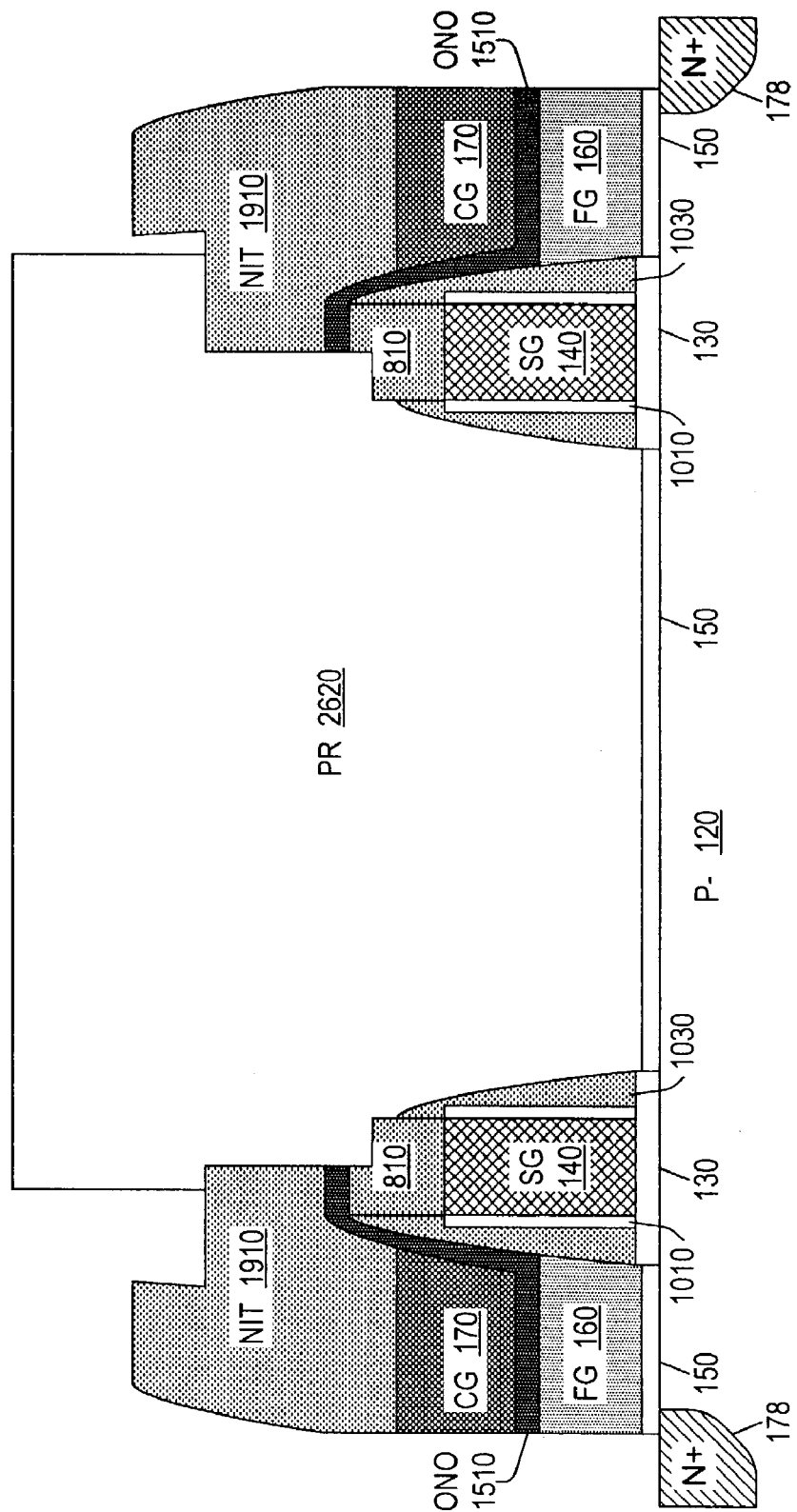
FIG. 25A (X-X')

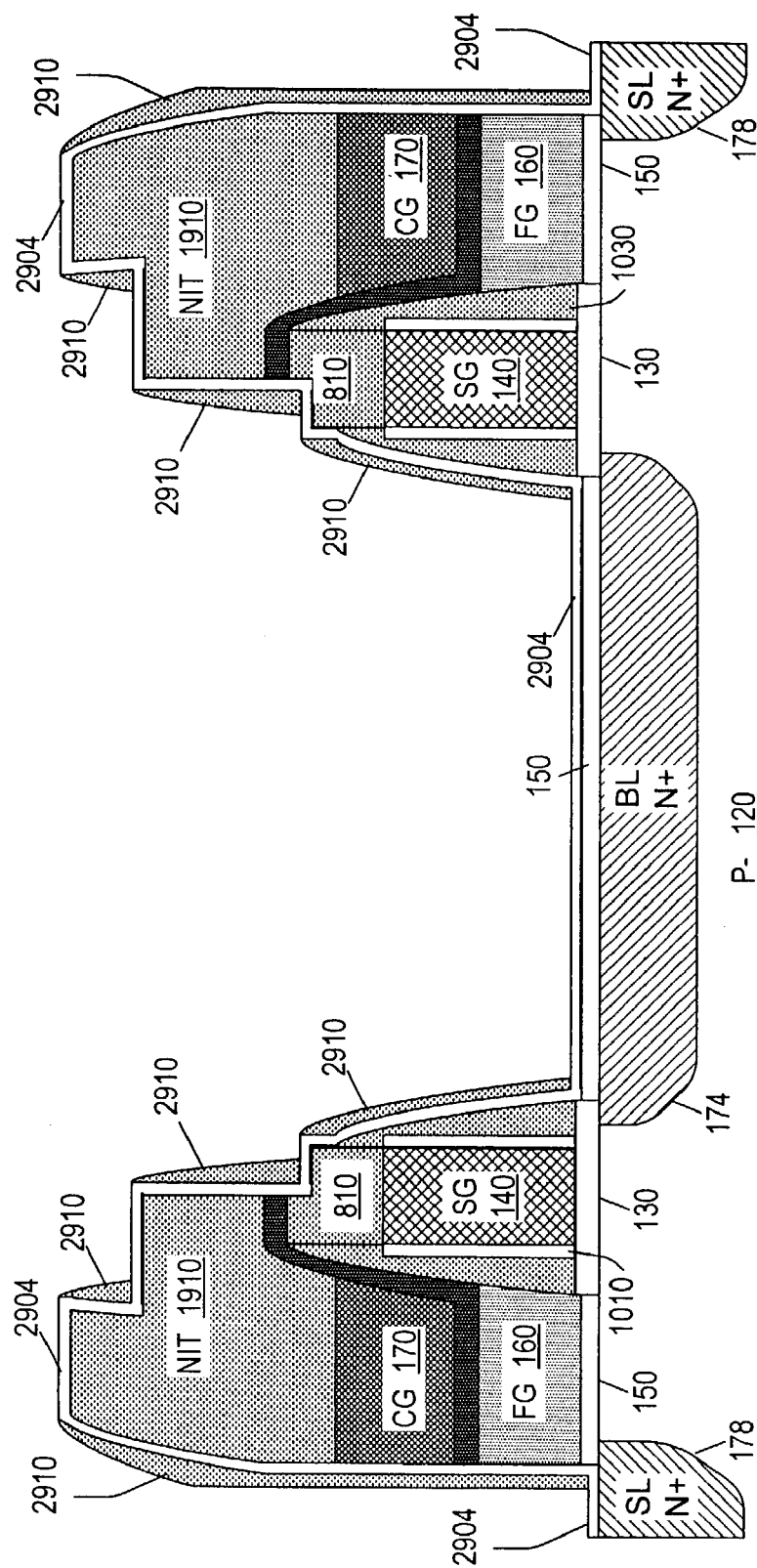
FIG. 26A (X-X')

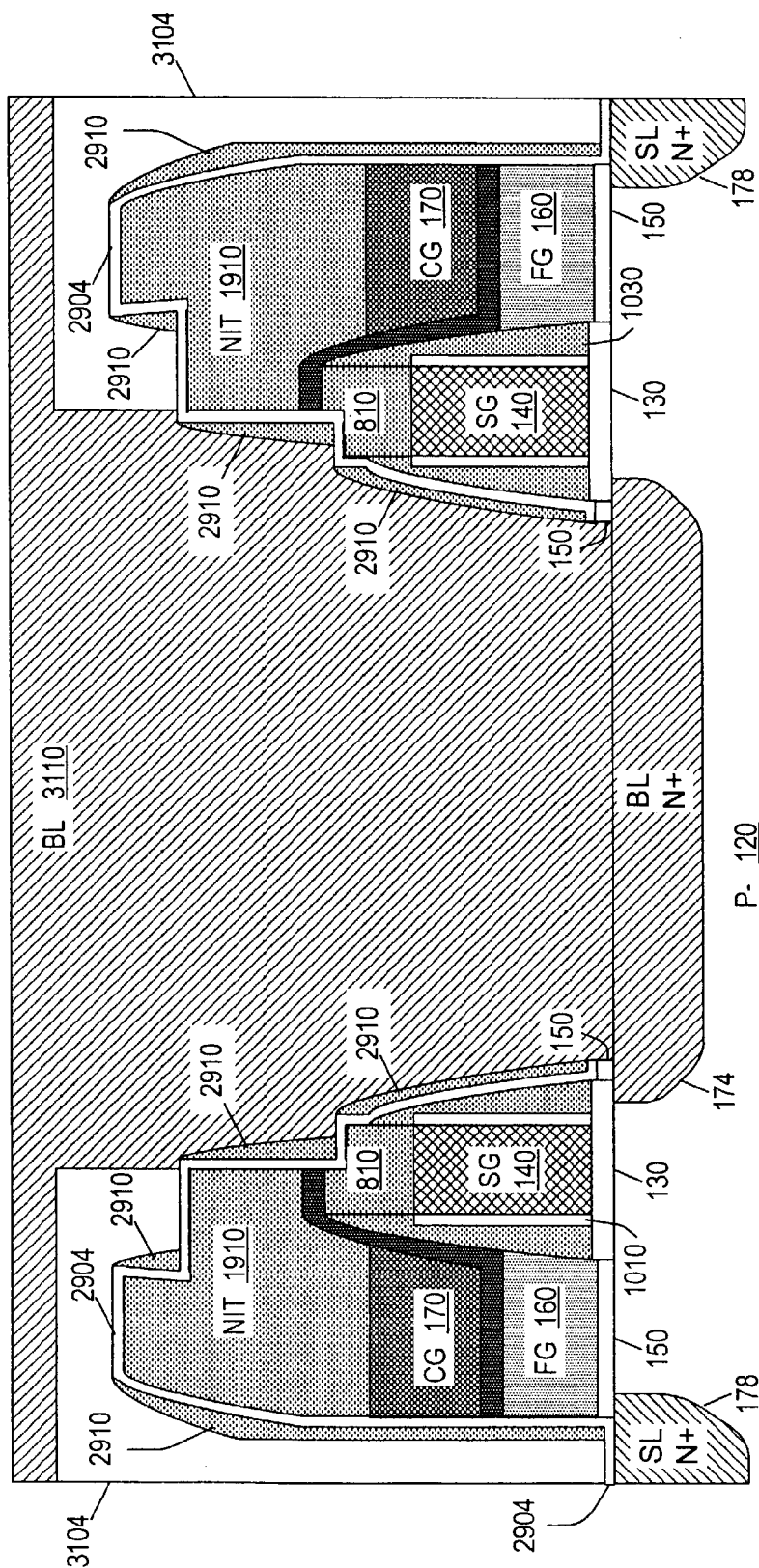
FIG. 27 (X-X')

US 6,995,060 B2

FABRICATION OF INTEGRATED CIRCUIT ELEMENTS IN STRUCTURES WITH PROTRUDING FEATURES

BACKGROUND OF THE INVENTION

The present invention relates to fabrication of integrated circuits.

In order to make the integrated circuits smaller, less expensive, and more reproducible, self-aligned fabrication processes have been developed. The self-aligned processes make the integrated circuit features less dependent on photolithography. For instance, a self-aligned process may define an edge of a feature made of multiple layers with a single photolithographic mask. Some features are defined without a mask. In one example, silicon dioxide spacers on the sidewalls of a MOS transistor gate are defined without a mask by depositing a conformal layer of silicon dioxide and then anisotropically etching the silicon dioxide until the oxide remains only on the sidewalls.

FIG. 1 illustrates a self-aligned fabrication process for a flash memory described in U.S. Pat. No. 6,057,575 issued May 2, 2000 to Jenq. The memory cell is formed in and over a semiconductor substrate 120. Silicon dioxide 130 is thermally grown on substrate 120. Select gate 140 is formed on oxide 130. Silicon dioxide 150 is thermally grown on a region of substrate 120 not covered by the select gate. ONO 154 (a sandwich of a layer of silicon dioxide, a layer of silicon nitride, and a layer of silicon dioxide) is formed on select gate 140. Floating gate 160 is formed on dielectric layers 150, 154. A portion of floating gate 160 overlies the select gate 140.

ONO layer 164 is formed on the floating and select gates. Control gate 170 is formed on ONO 164. The control gate overlies floating gate 160 and select gate 140.

N+ source and drain regions 174, 178 are formed in substrate 120.

The cell is fabricated by a self-aligned process in which the left and right edges of floating gate 160 and control gate 170 are defined by a single mask.

Another self-aligned fabrication process is described in Naruke et al., "A New Flash-Erase EEPROM Cell with a Sidewall Select-Gate on Its Source Side", IEDM Technical Digest 1989, pages 603–606. In that process, the floating and control gates are formed first in a stacked configuration. Then the select gate is formed as a sidewall spacer on a sidewall of a structure including the floating and control gates. The select gate is formed by a self-aligned process.

SUMMARY

This section summarizes some features of the invention. Other features are described in subsequent sections. The invention is defined by the appended claims which are incorporated into this section by reference.

The present invention includes self-aligned fabrication methods, but the invention is not limited to such methods.

In some embodiments of the present invention, integrated circuit elements are formed in a self-aligned manner over a sidewall of an upward protruding feature (e.g. a sidewall of a transistor gate). For example, in some embodiments, the floating and control gates of a flash memory cell are formed in a self-aligned manner over a sidewall of the select gate.

Other features of the invention are described below. The invention is defined by the appended claims.

BRIEF DESCRIPTION OF THE DRAWINGS

FIGS. 10, 11, 12, 13A, 13B, 14–19, 20A show cross sections of the memory of FIG. 2 in the process of fabrication.

FIGS. 21–24, 25A show cross sections of the memory of FIG. 2 in the process of fabrication.

FIG. 26A shows a cross section of the memory of FIG. 2 in the process of fabrication.

FIG. 27 shows a cross section of the memory of FIG. 2 in the process of fabrication.

DESCRIPTION OF SOME EMBODIMENTS

The embodiments described in this section illustrate but do not limit the invention. The invention is not limited to particular materials, process steps, or dimensions. The invention is defined by the appended claims.

The present invention will now be illustrated on the example of a split gate flash memory. The floating and control gates of the memory, and the dielectric insulating the floating gate from the control gate, are fabricated in a self-aligned manner as described below.

Figure 1:
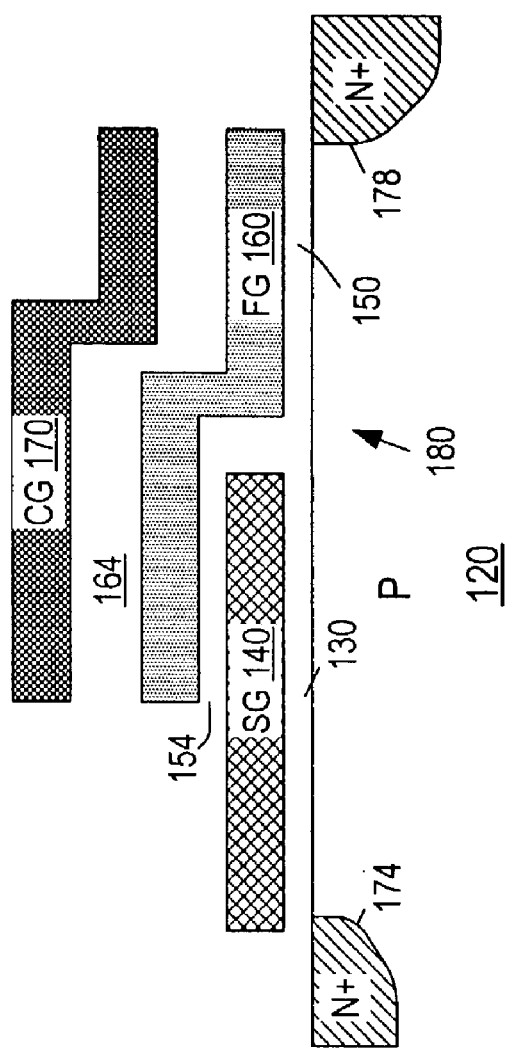
FIG. 1 shows a cross section of a prior art memory cell.
Figure 2:
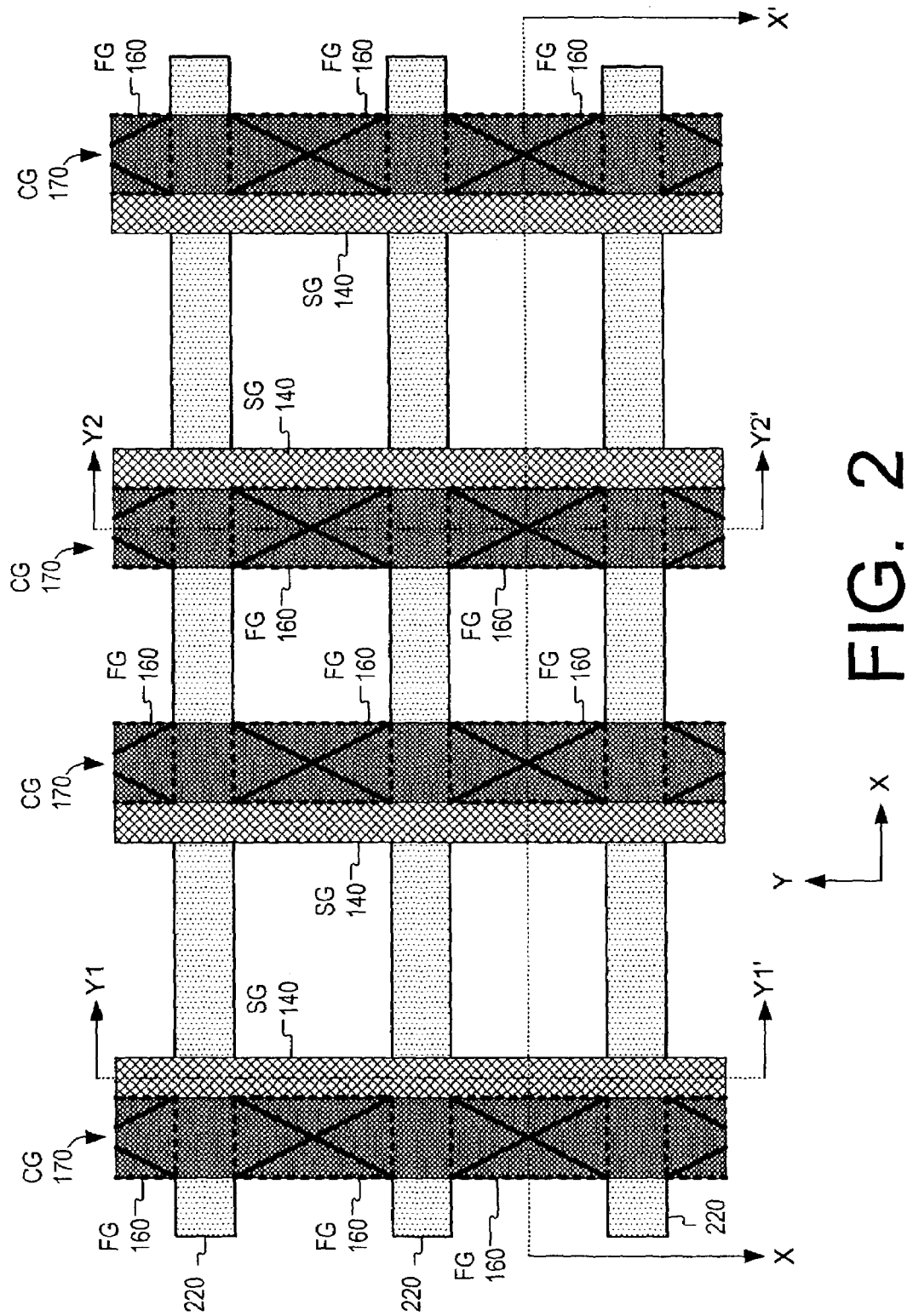
FIG. 2 is a top view of an intermediate structure obtained in the fabrication of a memory according to one embodiment of the present invention.
Figure 3:
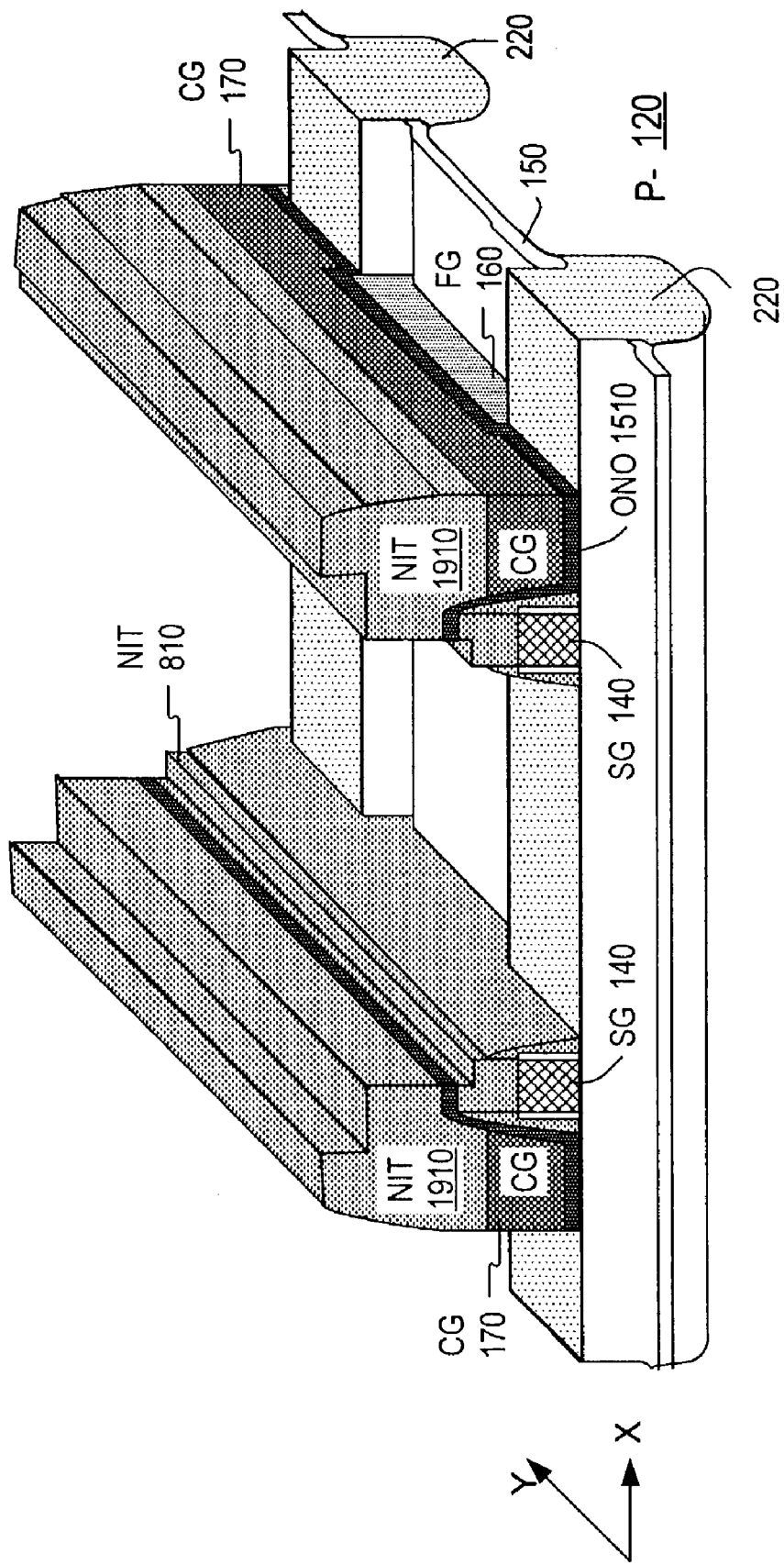
FIG. 3 is a perspective view of the memory of FIG. 2 in the process of fabrication.

FIG. 2 is a top view showing some features of the flash memory array. FIG. 3 is a perspective view showing additional features. Each memory cell includes a floating gate 160, a control gate 170, and a select gate 140. The floating, control and select gates are insulated from each other and from semiconductor substrate 120 (e.g. monocrystalline silicon). Each control gate 170 is part of a control gate line, also referenced by numeral 170, that extends in the Y direction across the array. In some embodiments, the Y direction is a row direction, and each control gate line 170 provides the control gates for one row of the memory cells. Different control gate lines 170 may or may not be electrically tied together. Floating gates 160 underlie the control gates. The position of each floating gate 160 is shown with a cross in FIG. 2. Each select gate 140 is part of a select gate line, also referenced at 140, extending across the array in the Y direction. Substrate isolation regions 220 (field isolation regions) extend in the X direction. In some embodiments, the X direction is the column (bitline) direction. Each region 220 traverses the entire array. Each select gate line 140 and each control gate line 170 crosses over all of the regions 220.

Subsequent figures illustrate vertical cross sections of intermediate structures obtained during the memory fabrication. The sectional planes are indicated in FIG. 2 by lines X–X', Y1–Y1', and Y2–Y2'. The line X–X' passes in the X direction between substrate isolation regions 220. The line Y1–Y1' passes in the Y direction through a select gate line 140. The line Y2–Y2' passes in the Y direction through a control gate line 170.

Figure 4:
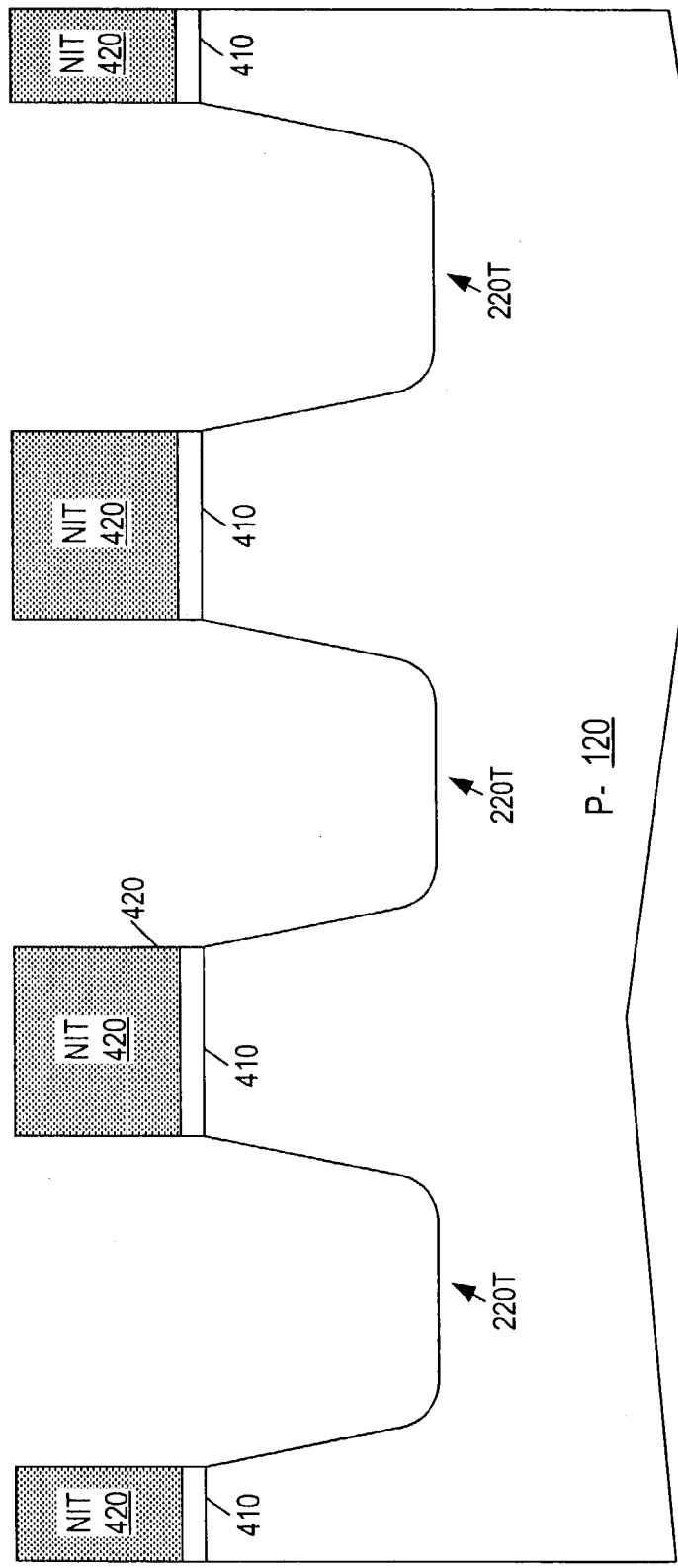
FIGS. 4–8 show cross sections of the memory of FIG. 2 in the process of fabrication.

In one embodiment, the memory is fabricated as follows. Substrate isolation regions 220 are formed in P doped substrate 120 by shallow trench isolation ("STI") technology. More particularly, as shown in FIG. 4 (the Y1–Y1' cross section), a silicon dioxide layer 410 (pad oxide) is formed on substrate 120 by thermal oxidation or some other technique. Silicon nitride 420 is deposited on oxide 410. Nitride 420 is patterned photolithographically, using a photoresist mask (not shown), to define isolation trenches 220T. Oxide 410 and substrate 120 are etched through the openings in nitride 420. Trenches 220T are formed in the substrate as a result. Each trench 220T traverses the entire memory array in the X direction.

Nitride 420 is subjected to a timed wet etch to recess the vertical edges of the nitride layer away from trenches 220T. See FIG. 5 (cross section Y1–Y1'). Oxide 410 is also recessed away from the trenches in this step.

A thin layer 220.1 of silicon dioxide is thermally grown on the exposed silicon surfaces to round the edges of trenches 220T. Then silicon dioxide 220.2 is deposited using a high density plasma technique (HDP). Oxide 220.2 fills the trenches and initially covers the nitride 420. Oxide 220.2 is polished by chemical mechanical polishing (CMP). The polishing stops on nitride 420. A planar top surface is provided.

In the subsequent figures and FIGS. 2 and 3, the layers 220.1, 220.2 are shown as a single layer 220.

Figure 5:
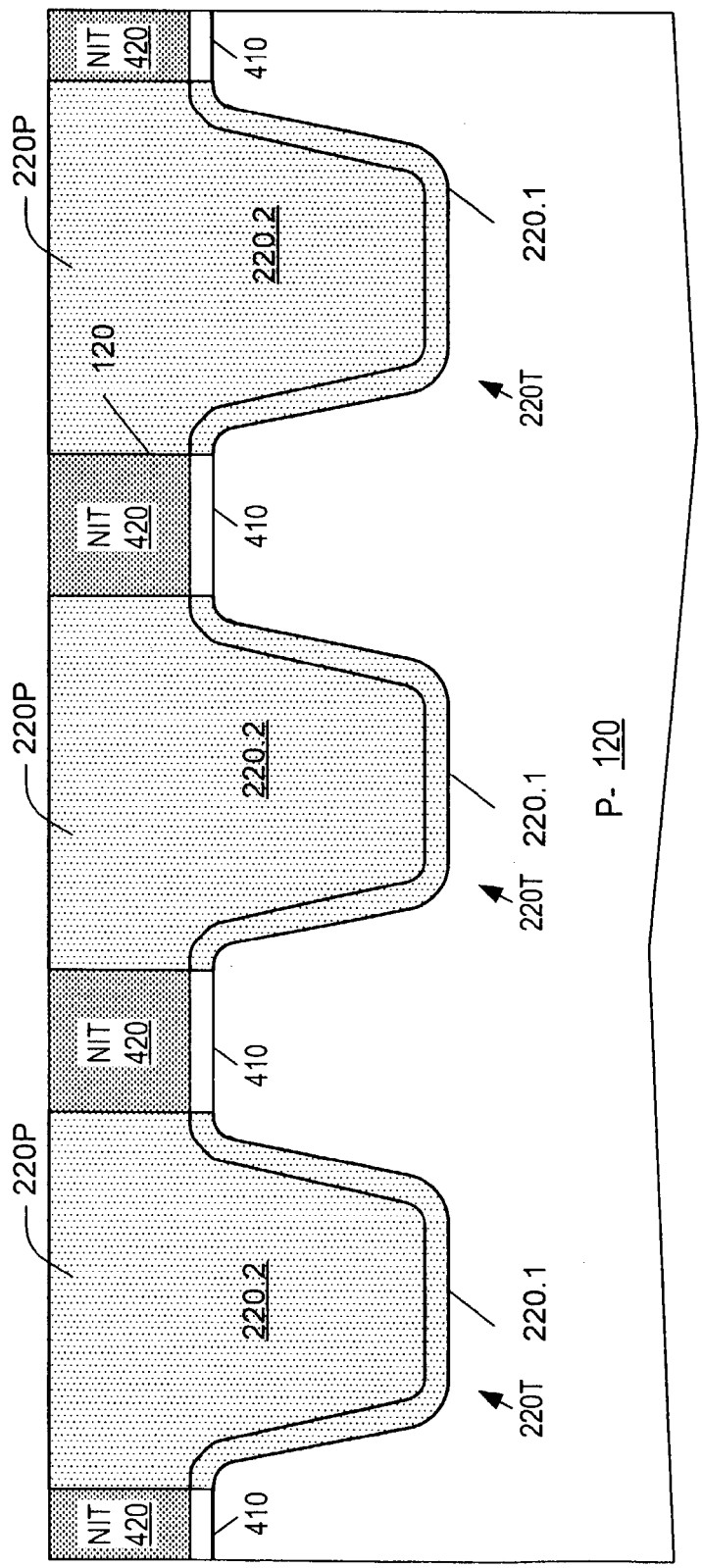

As shown in FIG. 5, oxide 220 protrudes above the substrate 120 by an amount equal to the combined thickness of nitride 420 and oxide 410. The protruding portions of oxide 220 are shown at 220P.

Figure 6:
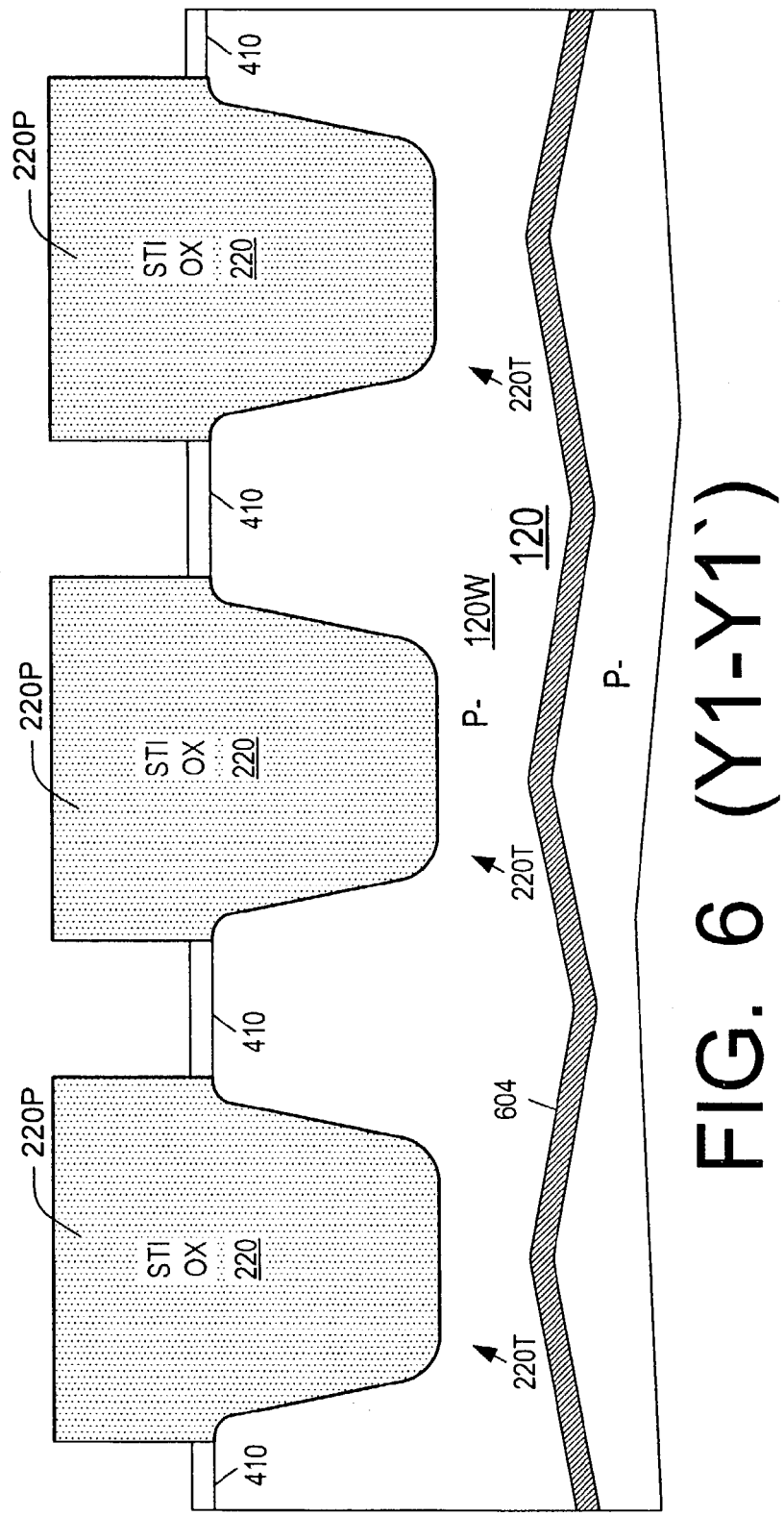

Nitride 420 is removed selectively to oxide 220 (FIG. 6, cross section Y1–Y1'). This can be done by a wet etch (e.g. with phosphoric acid).

Dopant is implanted into substrate 120 to form an N type region 604 underlying the memory array. Dopant is also implanted into the substrate around the array to form an N type region (not shown) extending from the top surface of substrate 120 down to region 604. These implants create a fully isolated P well 120 W for the memory array. Region 604 is not shown in the subsequent drawings.

Figure 7:
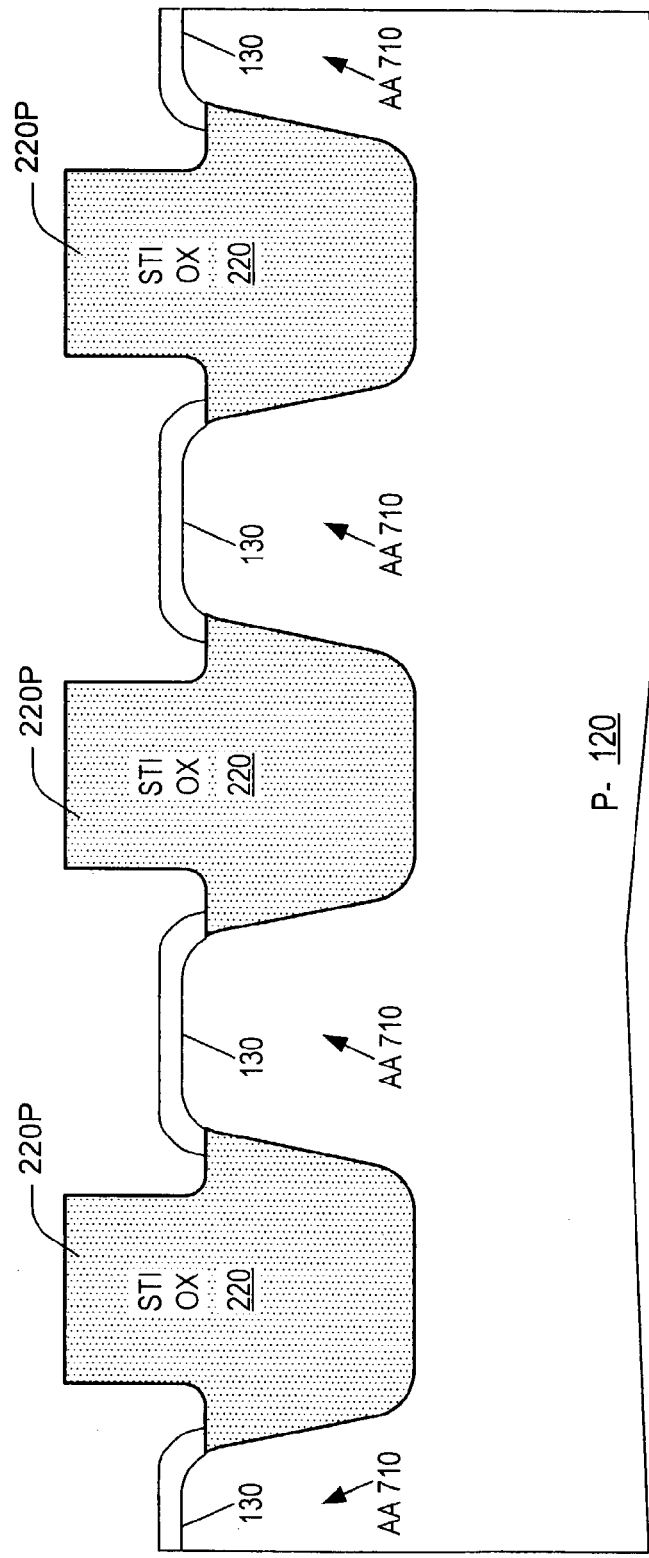

Oxide 220 is subjected to an etch (FIG. 7, cross section Y1–Y1'). The etch includes a horizontal component that causes the sidewalls of oxide 220 to be laterally recessed away from active areas 710 (the substrate areas not occupied by trenches 220T). The etch can be an isotropic wet etch. A buffered oxide etch or a dilute HF (DHF) etch is used in some embodiments. This etch will result in improved capacitive coupling between the floating and control gates. See U.S. patent application Ser. No. 10/262,785 filed Oct. 1, 2002 by Yi Ding and incorporated herein by reference.

Portions 220P of oxide 220 are not etched away, and they continue to protrude above the top surface of substrate 120. An exemplary final thickness of the protruding portions 220P is 0.12 $\mu$m for a 0.18 $\mu$m fabrication process (a process with a 0.18 $\mu$m minimum line width). The exemplary dimensions given in this section assume a 0.18 $\mu$m fabrication process unless mentioned otherwise.

Pad oxide 410 is removed during the etch of oxide 220.

Silicon dioxide 130 is thermally grown on the exposed areas of substrate 120 to provide gate dielectric for the select transistors. An exemplary thickness of oxide 130 is 120 Å.

Figure 8:
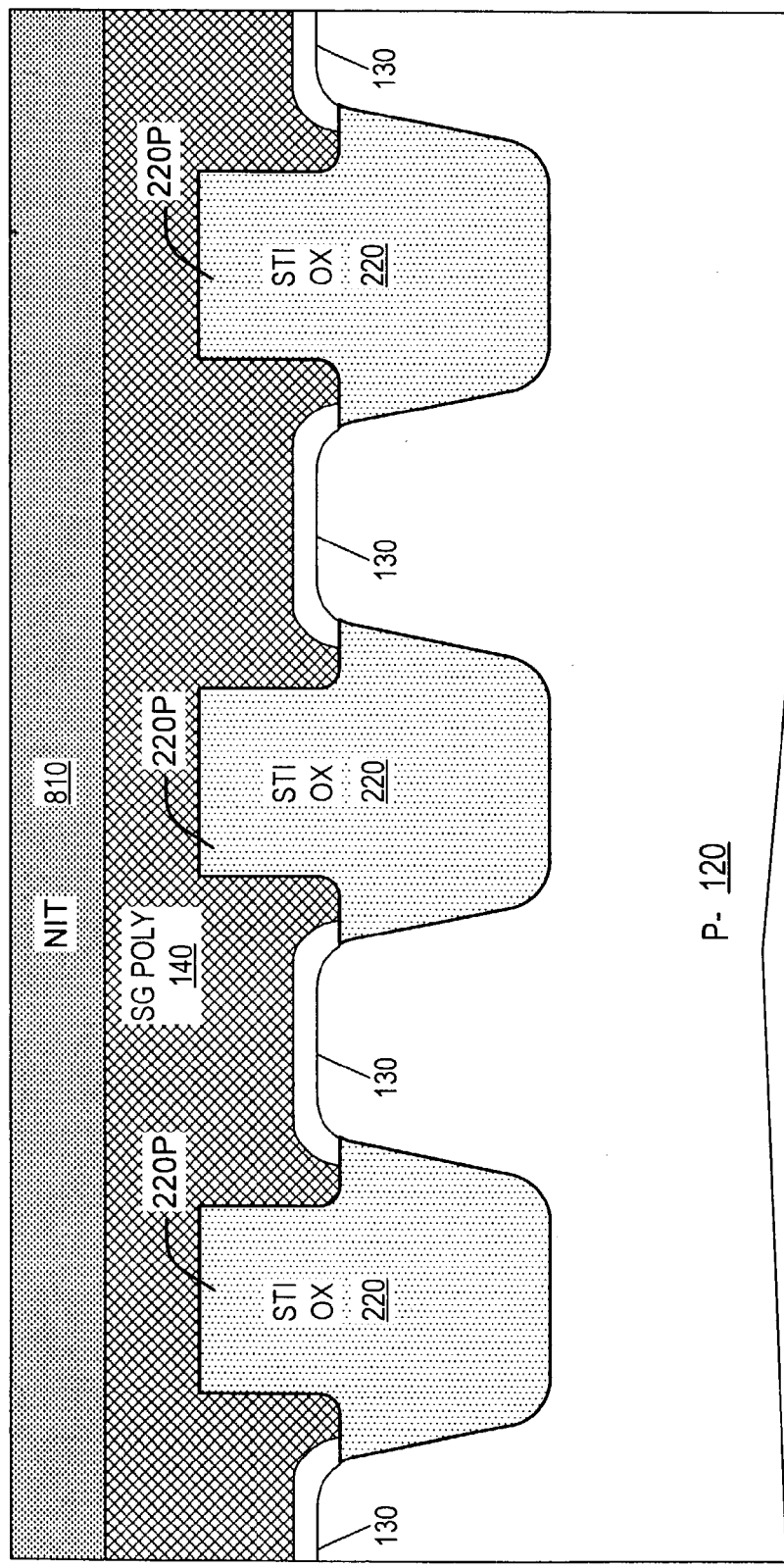

As shown in FIG. 8 (cross section Y1–Y1'), a conductive polysilicon layer 140 is formed over the structure by a conformal deposition process (e.g. low pressure chemical vapor deposition, "LPCVD"). Polysilicon 140 fills the spaces between the oxide protrusions 220P. The top polysilicon surface is planar because the polysilicon portions deposited on the sidewalls of protrusions 220P meet together.

Non-conformal deposition processes, whether known or to be invented, can also be used. If the top surface of polysilicon 140 is not planar, it is believed that the polysilicon 140 can be planarized after the deposition using known techniques (e.g. spinning a photoresist layer over the polysilicon 140 and then simultaneously etching the resist and the polysilicon at equal etch rates until all of the photoresist is removed). The bottom surface of polysilicon 140 is non-planar as it goes up and down over the oxide protrusions 220P.

An exemplary final thickness of polysilicon 140 is 0.06 $\mu$m over the active areas.

Silicon nitride 810 is deposited on polysilicon 140, by LPCVD for example, to an exemplary thickness of 1500 Å. If desired, a pad oxide layer (not shown) can be formed on polysilicon 140 before the nitride deposition. The pad oxide layer will provide an additional protection for the select gates during the etch of control gate polysilicon 170 described below in connection with FIG. 18.

In some embodiments, the top surface of polysilicon 140 and/or nitride 810 is not planar.

Figure 9:
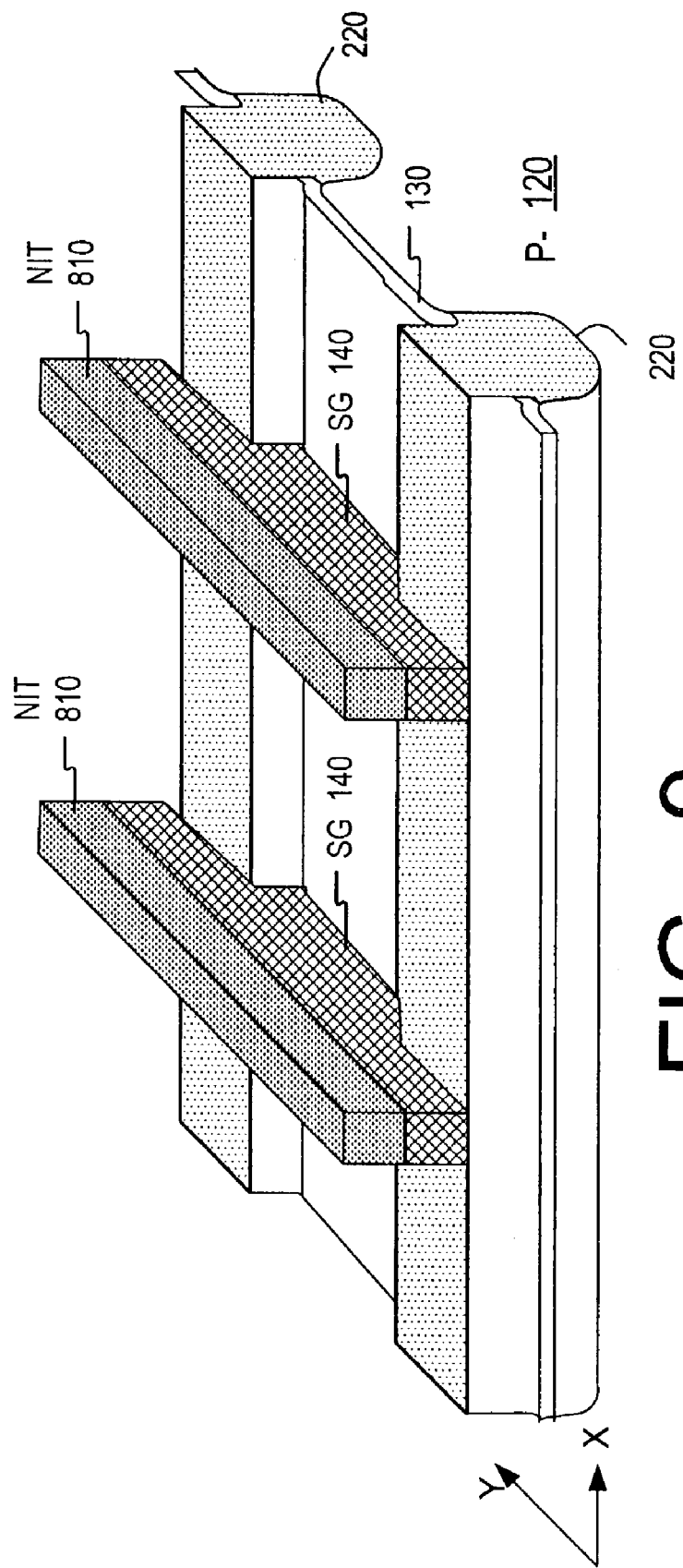
FIG. 9 is a perspective view of the memory of FIG. 2 in the process of fabrication.

The wafer is coated with a photoresist layer (not shown). The resist is patterned to define select gate lines 140. See FIG. 2, and see also the perspective view in FIG. 9. Each select gate line 140 extends in the Y direction through the entire array. The memory array geometry is not sensitive to a misalignment between the mask defining the lines 140 and the mask defining the isolation trenches 220T (FIG. 4) except possibly at the boundary of the memory array.

Silicon nitride 810 is etched through the resist openings. The resist is removed, and polysilicon 140 is etched away where exposed by nitride 810. Select gate lines 140 are formed as a result. (In an alternative embodiment, the resist defining the nitride 810 is removed after the etch of polysilicon 140.)

As shown in FIG. 10 (cross section X–X'), the structure is oxidized to grow silicon dioxide 1010 on the sidewalls of select gate lines 140. Then a thin conformal silicon nitride layer 1030 is deposited and etched anisotropically, without a mask over the memory array, to form spacers on the sidewalls of each structure consisting of a select gate line 140, the overlying nitride 810, and the sidewall oxide 1010. Formation of silicon nitride spacers is described, for example, in U.S. Pat. No. 6,355,524 issued Mar. 12, 2002 to H. Tuan et al. and incorporated herein by reference.

A blanket oxide etch removes the exposed portions of silicon dioxide 130. Silicon dioxide 150 (FIG. 11, cross section X–X') is thermally grown on substrate 120 to a desired thickness, e.g. 90 Å.

Floating gate polysilicon 160 is deposited over the structure, by LPCVD for example, and is doped during or after the deposition. Polysilicon 160 is sufficiently thick to ensure that the top surface of layer 160 is at least as high as the top surface of nitride 810. In particular, the top surface of polysilicon 160 includes regions 160T between the select gates 140. Regions 160T are at least as high as the top surface of nitride 810.

Layer 160 is planarized by a CMP process that stops on nitride 810, or by some other process. See FIG. 12 (cross section X–X'). The top surface of polysilicon 160 becomes coplanar with the top surface of nitride 810. CMP processes and slurries are known that allow one to avoid dishing in the top surface of the polysilicon layer.

Then polysilicon 160 is etched. Layer 160 is not masked in the memory array area. See FIGS. 13A (cross section X–X') and 13B (cross section Y2–Y2'). The etch stops when trench oxide 220 becomes exposed. A suitable overetch is performed to completely remove the polysilicon 160 from the top surface of oxide 220. In some embodiments, the final thickness of layer 160 is 1200 Å.

Optionally, a timed etch of oxide 220 is performed to recess the top surface of oxide 220 below the surface of polysilicon 160. See FIG. 14 (cross section Y2–Y2'). This etch will improve the capacitive coupling between the floating and control gates. See the aforementioned U.S. Pat. No. 6,355,524. In the embodiment of FIG. 14, the oxide 220 continues to protrude above the top surface of substrate 120, as shown at 220P, by at least 0.10 $\mu$m. In other embodiments, the oxide 220 does not protrude above the substrate after the etch.

ONO layer 1510 (FIG. 15, cross section X–X') is formed over the structure. For example, a silicon dioxide layer can be thermally grown on polysilicon 160 or deposited by a high temperature oxidation process (HTO) to a thickness of 50 Å. (HTO is described, for example, in U.S. patent application published as No. 2002/0197888 on Dec. 26, 2002, incorporated herein by reference). Then a silicon nitride layer can be deposited by LPCVD to a thickness of 80 Å. Then another silicon dioxide layer can be deposited by HTO to a thickness of 50 Å. These processes and thickness values are exemplary and not limiting.

Control gate polysilicon layer 170 (FIG. 16, cross section X–X') is deposited on ONO 1510. Polysilicon 170 is doped N+ in the memory array area during or after the deposition.

The top surface of polysilicon 170 is not planar. Layer 170 has a protruding portion 170.1 over each select gate line 140. The protrusions 170.1 will be used to define the control and floating gates without additional dependence on photolithographic alignment.

As shown in FIG. 16, cavities 170C form in layer 170 between protrusions 170.1. As shown in FIG. 17 (cross section X–X'), these cavities are filled with some material 1710. In one embodiment, material 1710 is silicon dioxide deposited on polysilicon 170 and planarized by CMP or some other process. The memory array area has a planar top surface, with polysilicon 170 exposed.

Polysilicon 170 is etched without a mask selectively to oxide 1710. See FIG. 18 (cross section X–X'). This etch attacks the polysilicon portions 170.1 and creates cavities 1810 in the top surface of the structure. Polysilicon 170 is recessed relative to oxide 1710 in these cavities. In the embodiment of FIG. 18, this etch exposes ONO 1510, and continues for some time to recess the top surface of polysilicon 170 below the top surface of ONO 1510. This is not necessary however. The polysilicon etch can stop before exposing the ONO 1510, or the etch can stop when the ONO layer becomes exposed. If ONO 1510 is exposed, the width W1 of the polysilicon layer 170 in cavities 1810 on a side of select gate 140 will define the width of the control and floating gates in a self-aligned manner as will be illustrated below.

In some embodiments, the minimum thickness of polysilicon 170 (at the bottom of cavities 1810) is 0.18 $\mu$m, and the width W1 is also 0.18 $\mu$m. In FIG. 18, the top surface of polysilicon 170 is recessed in cavities 1810. In another embodiment, polysilicon 170 has a planar top surface throughout the memory array area.

A protective material is deposited into cavities 1810 to protect the polysilicon 170 portions near the select gates 140. In one embodiment, this material is silicon nitride 1910 (see FIG. 19, cross section X–X'). Nitride 1910 is deposited over the structure and polished by CMP until the oxide 1710 is exposed in the memory array area. See FIG. 20A (cross section X–X'). Nitride 1910 remains in cavities 1810.

Instead of CMP, the nitride 1910 can be processed by depositing a layer of material (not shown) having a planar top surface, and etching that material and the nitride with equal etch rates until the oxide 1710 is exposed. The material can be photoresist. The material can be removed after the nitride etch.

An antireflective coating layer (ARC) 2010, shown in FIG. 20A, is flowed on nitride 1910 and cured. The structure has a planar top surface after this step.

Figure 20B:
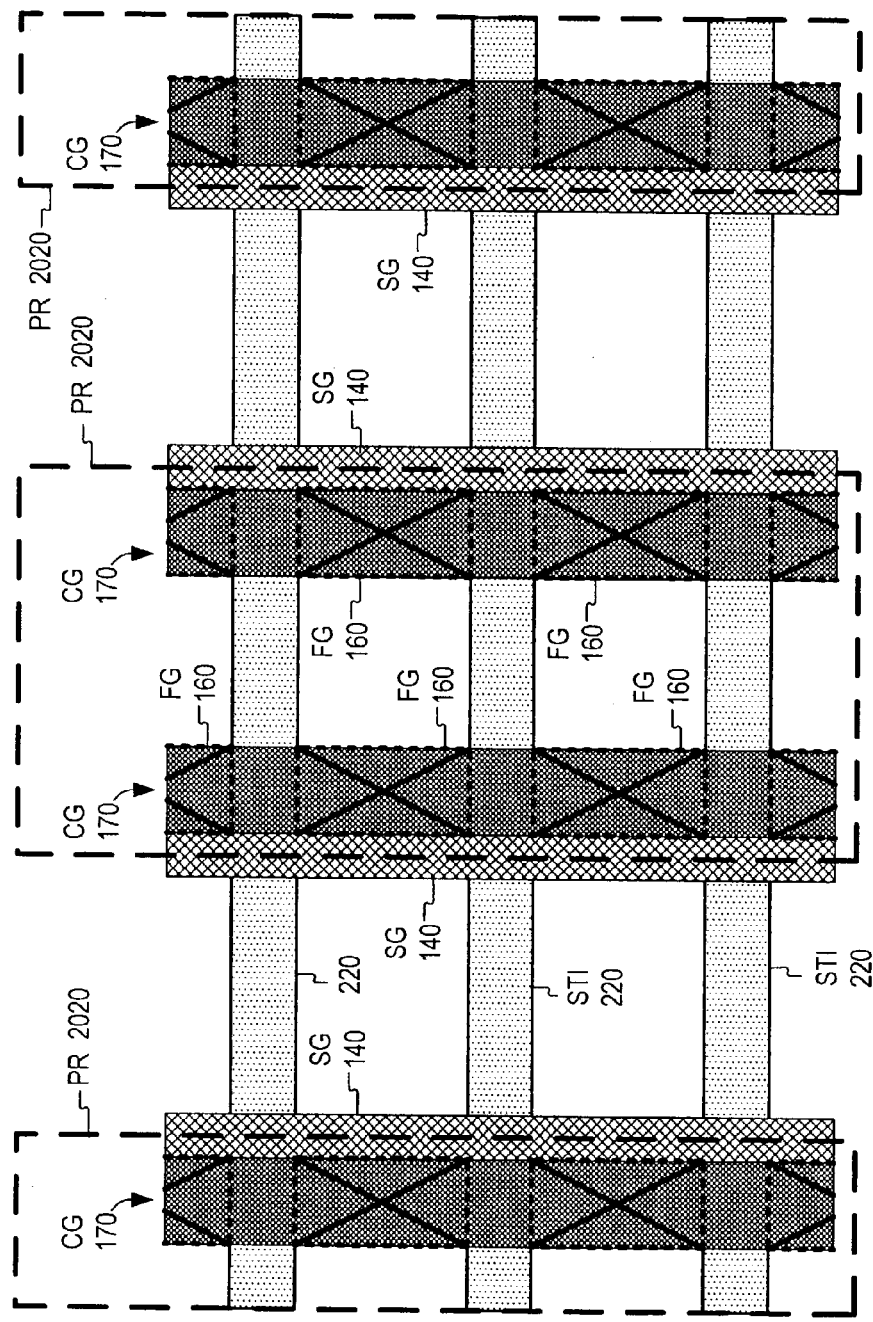
FIG. 20B is a top view of the structure of FIG. 20A.

The wafer is coated with a photoresist layer 2020. The resist is patterned to protect the portion of nitride 1910 on one side of each select gate line 140. FIG. 20B (top view) illustrates the position of mask 2020 with respect to the features shown in FIG. 2. Resist 2020 overlies the future positions of control gate lines 170, and exposes those areas between the adjacent select gate lines 140 in which the control gate polysilicon 170 will be removed. The longitudinal edges of mask 2020 can be located anywhere over the select gate lines 140. The precise mask alignment is therefore not critical in the array area.

Silicon nitride 1910 and ARC 2010 are etched away where exposed by resist 2020. Resist 2020 and the remaining portions of ARC 2010 are then removed. The resulting memory array structure is shown in FIG. 21 (cross section X–X'). Nitride 1910 protects the polysilicon 170 portions of the width W1 (FIGS. 18, 21) at the bottom of cavities 1810.

Oxide 1710 is etched away by a blanket etch. The resulting structure is shown in FIG. 22 (cross section X–X').

Polysilicon 170 is etched in the array area with nitride 1910 as a mask. The etch is selective to silicon dioxide, so the etch stops on ONO 1510. The resulting structure is shown in FIG. 23 (cross section X–X').

ONO 1510 and polysilicon 160 are etched with nitride 1910 as a mask. Layers 1510, 160 are completely removed from the areas not covered by nitride 1910. See FIG. 24 (cross section X–X'). Nitride layers 1910, 810, 1030 can be partially removed during the etch of ONO 1510. Floating gates 160 and control gate lines 170 are fully defined at the conclusion of this step, and are as in FIGS. 2 and 3. The width of the top surface of control gate line 170 is W1, defined as described above in connection with FIG. 18.

Figure 25B:
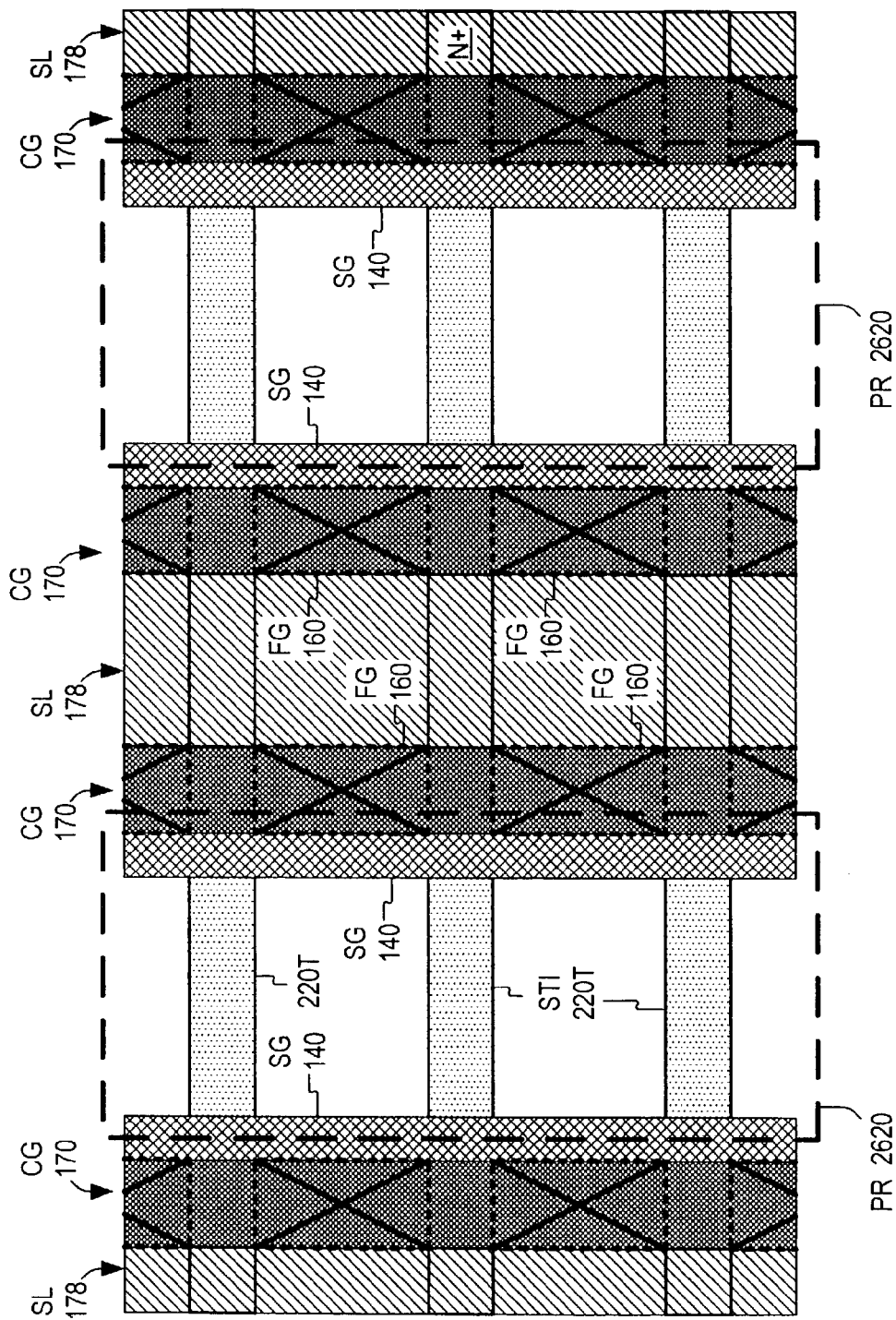
FIG. 25B is a top view of the structure of FIG. 25A.

The wafer is coated with photoresist 2620. The resist is patterned to expose the source lines 178 (FIG. 25A, cross section X–X', and FIG. 25B, top view of the array without the dielectric layers). Each source line 178 traverses the memory array between two adjacent control gate lines 170, and provides one source/drain region to each cell in the two rows associated with the two control gate lines.

The alignment of mask 2620 is not critical because the left and right edges of the mask openings can be positioned anywhere over the respective select gate lines 140 or control gate lines 170.

Silicon dioxide 220 is etched out of trenches 220T in the areas exposed by mask 2620, i.e. the areas of source lines 178. This etch removes oxide 150 in the active areas over the source lines. Then the source line implant (N+) is performed using the same mask. In some embodiments, this is a high energy, high dose implant, possibly preceded by a lower energy, low dose, large angled implant (the angle can be 10° to 30° for example), to achieve a 0.1 µm to 0.2 µm source line diffusion depth.

In an alternative embodiment, mask 2620 is formed, then a high energy N+ implant is performed before etching out the oxide 220, then the oxide 220 is etched out of the trenches using the same mask, and then another, lower energy N type implant is performed using the same mask. The first (high energy) implant is at least partially blocked by oxide 220 in the trenches to avoid shorting the source lines 178 to N type isolation region 604 (FIG. 6). See the aforementioned U.S. Pat. No. 6,355,524.

Resist 2620 is removed. A thin silicon dioxide layer 2904 (FIG. 26A, cross section X–X') is deposited over the structure by any suitable technique (e.g. TEOS, HTO, RTO). An exemplary thickness of oxide 2904 on the silicon surface of substrate 120 is 200 Å to 300 Å. If oxide 2904 is deposited thermally (e.g. by RTO, rapid thermal oxidation), the oxide will be much thinner on the silicon nitride surfaces.

Figure 26B:
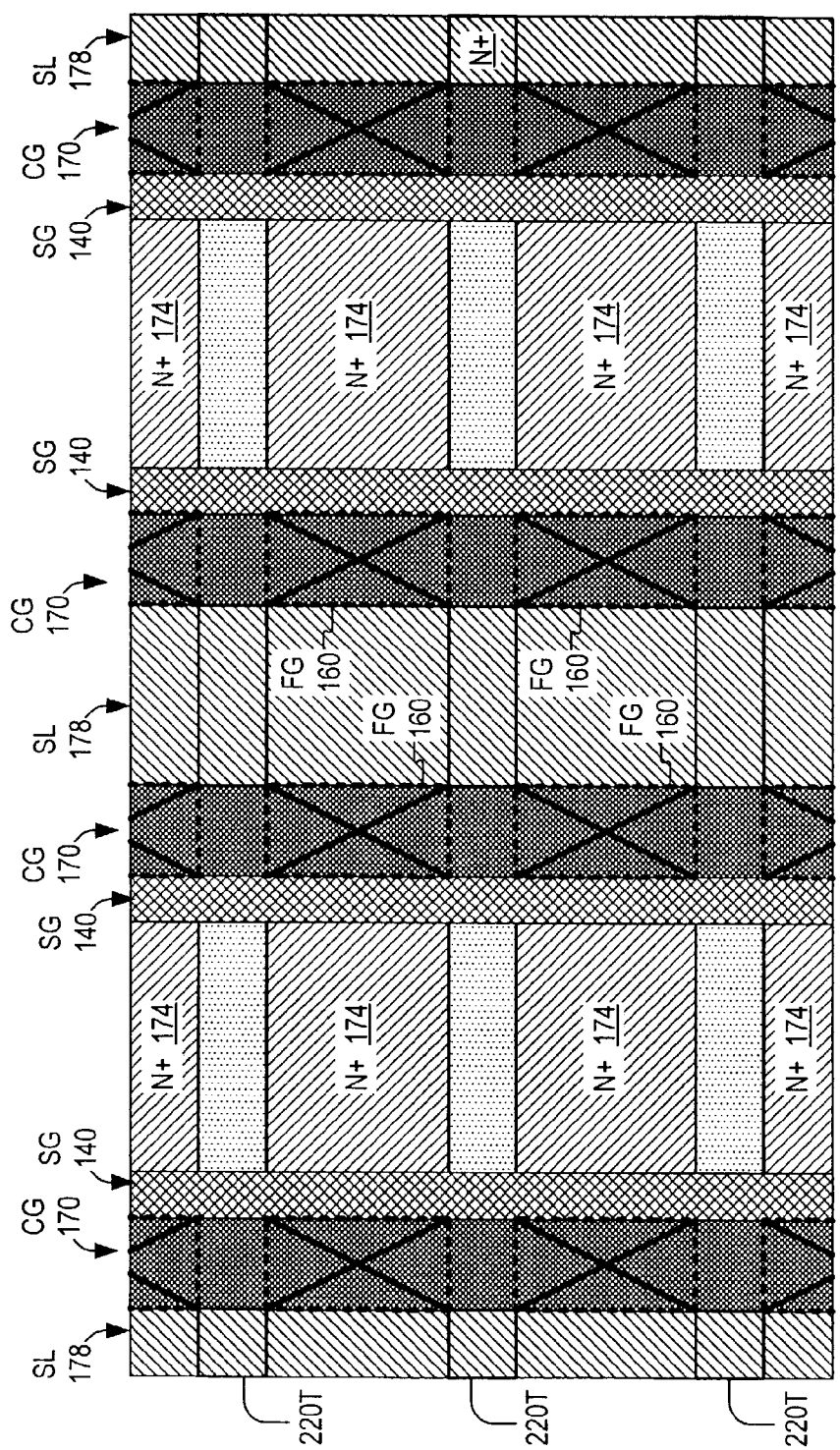
FIG. 26B is a top view of the structure of FIG. 26A.

A thin silicon nitride layer 2910 is deposited and etched anisotropically without a mask to form sidewall spacers on the gates of the peripheral transistors (not shown). Spacers 2910 also form in the memory array. Oxide 2904 serves as an etch stop protecting the substrate 120. An N+ implant is performed to create LDD (lightly doped drain) structures for the peripheral NMOS transistors (not shown), increase the dopant concentration in the peripheral NMOS transistor gates and in source line regions 178, and to dope bitline regions 174. FIG. 26B is a top view of the resulting memory array structure. The floating, control and select gates and the overlying nitride layers mask this implant so no additional masking in the array area is needed.

The memory fabrication can be completed using known techniques. In the example of FIG. 27, inter-level dielectric 3104 is deposited over the wafer. Contact openings are etched in dielectric layers 3104, 2904, 150 to expose the bitline regions 174. A conductive layer 3110 is deposited and patterned to form the bitlines that contact the bitline regions 174. If the layers 3104, 2904, 150 are formed from silicon oxide, the alignment of the mask (not shown) defining the contact openings is not critical because the select gates 140 are protected by nitride layers 2910, 1030.

Figure 28:
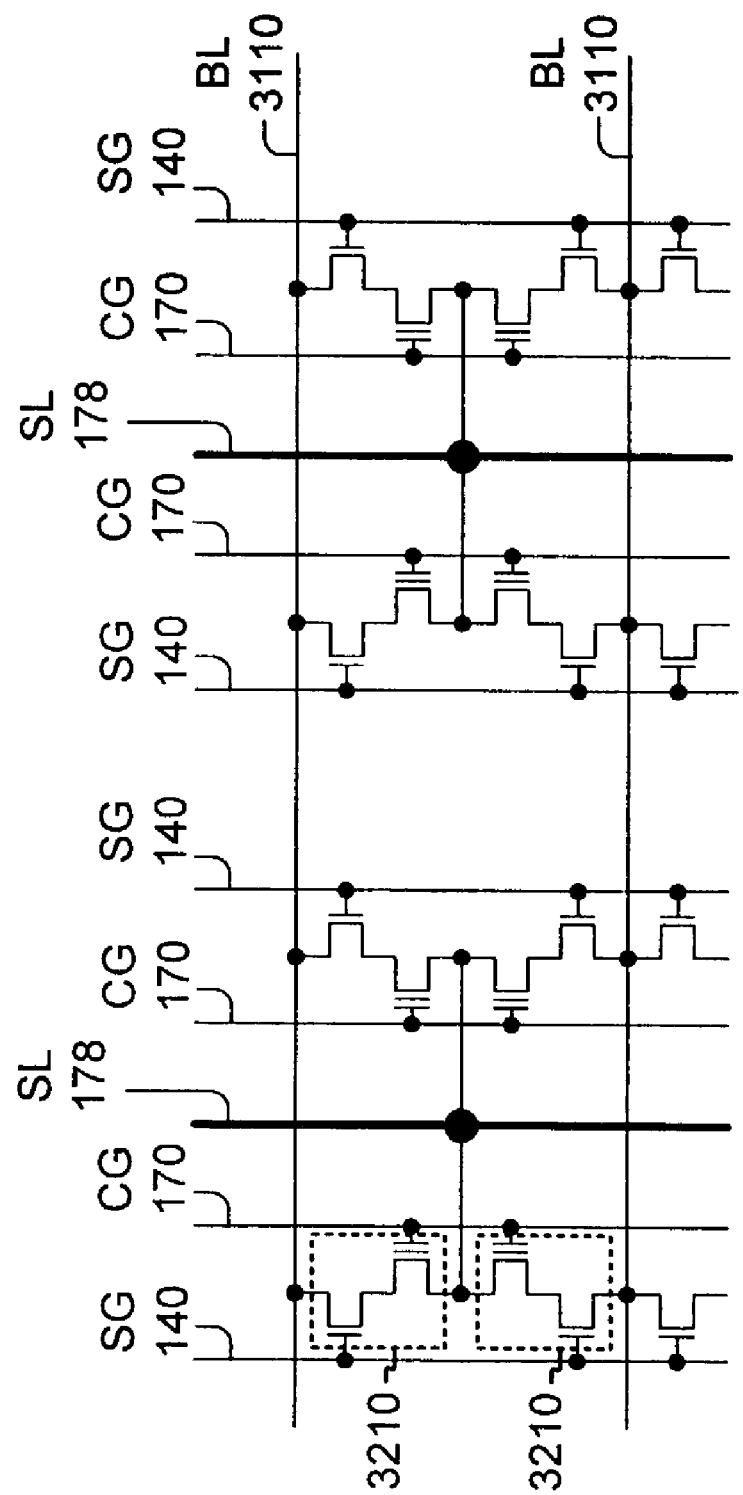
FIG. 28 is a circuit diagram of the memory of FIG. 2.

FIG. 28 is a circuit diagram of one embodiment of the array. This is a NOR array, of the type described in the aforementioned U.S. Pat. No. 6,355,524. Each bitline 3110 is shared by two columns of the memory cells 3210. A cell 3210 is programmed by hot electron injection from the cell's channel region (the P type region in substrate 120 below the cell's floating and select gates) to floating gate 160. The cell is erased by Fowler-Nordheim tunneling of electrons from floating gate 160 to source line region 178 or the channel region.

Other details of the memory fabrication process are given in U.S. patent application Ser. No. 10/393,212, filed by Yi Ding on Mar. 19, 2003 and incorporated herein by reference.

Figure 29:
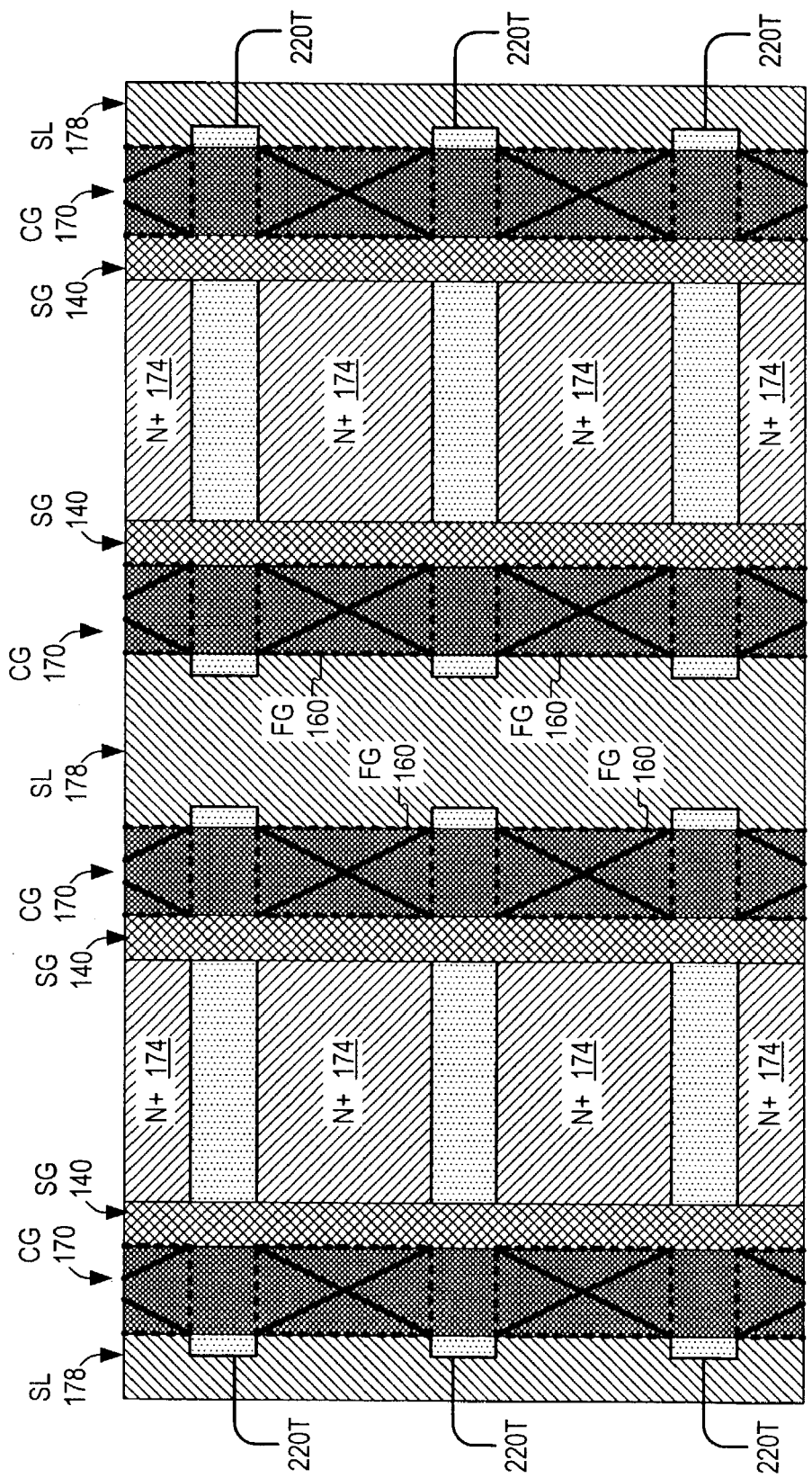
FIG. 29 is a top view of a memory array according to one embodiment of the present invention.

The invention is not limited to such erase or programming techniques or to NOR memory arrays. The invention is not limited to the array architectures described above. For example, the source lines can be formed from a layer overlying the substrate 120 and contacting the source line substrate regions 178; the source lines do not have to go through the isolation trenches. Also, substrate isolation regions 220 do not have to traverse the entire array. In FIG. 29, the substrate isolation regions are interrupted at source lines 178. Dielectric 220 does not have to be etched out of the trenches before the source lines are doped. Shallow trench isolation can be replaced with LOCOS or other isolation types, known or to be invented. The invention is applicable to multi-level cell memories (the memories in which the cell may contain multiple bits of information).

Figure 30:
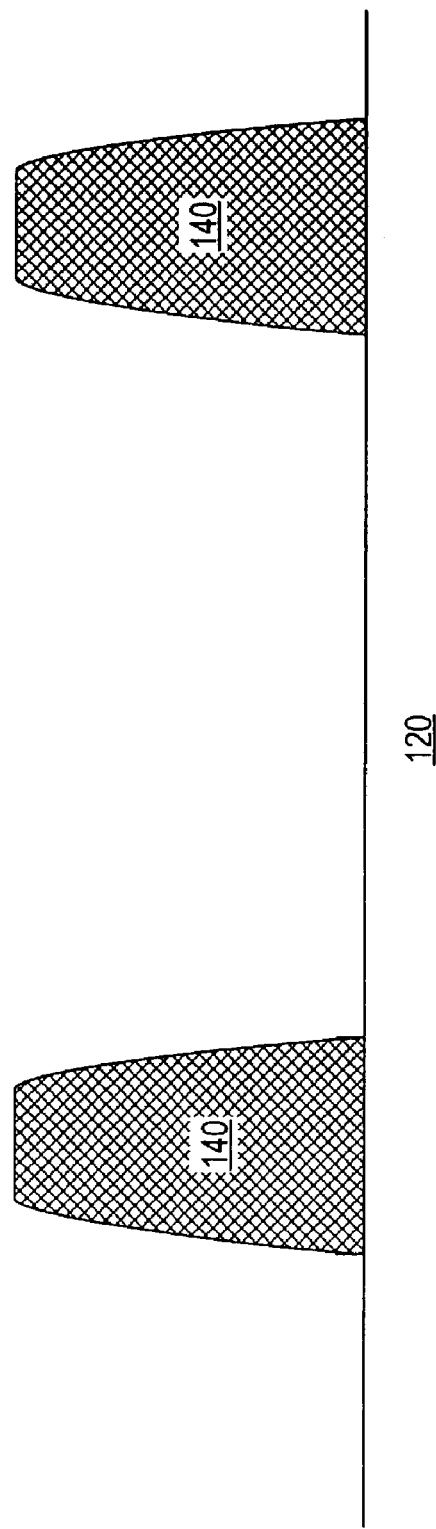
FIGS. 30–36 show cross sections of an integrated circuit in the process of fabrication according to the present invention.

The invention is not limited to memories. FIG. 30 illustrates a cross section of a semiconductor structure in the process of fabrication. This can be a non-memory structure. The structure includes a semiconductor substrate 120 and upward protrusions 140. Each protrusion 140 is shown as a feature formed on the top surface of substrate 120, but the features 140 can be part of substrate 120, or they can be made from layers made on top of other layers formed on substrate 120.

In a flash memory, each feature 140 can be a select gate, or a combination of a select gate and other layers (e.g. layers 1010, 1030, 810 of FIG. 10).

Figure 31:
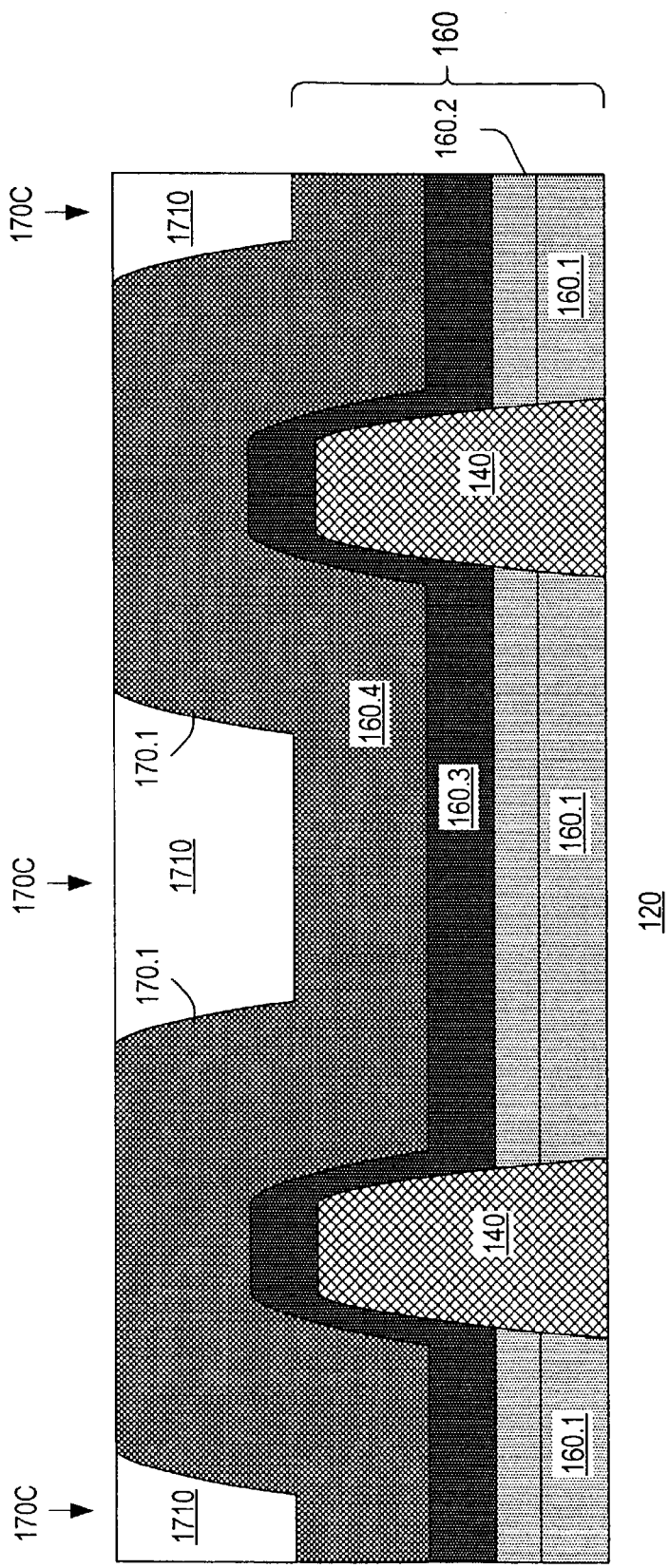

Self-aligned features are formed adjacent to protrusions 140 from a layer 160 (FIG. 31). Layer 160 is a combination of sub-layers 160.1, 160.2, 160.3, 160.4. Four sub-layers 160.1–160.4 are shown, but any number of sub-layers 160.$i$ ($i$=0, 1, . . . ) can be present, and each sub-layer in its turn may consist of multiple sub-layers. Different layers 160.$i$ may be made of different materials. Each layer 160.$i$ may or may not be patterned before other layers 160.$i$ are deposited. In FIG. 31, layers 160.3, 160.4 overlie the protrusions 140, but the layers 160.1, 160.2 do not. Layer 160.1 may have been deposited over the structure and then etched off from over the features 140. Then layer 160.2 may have been deposited and etched in a similar manner. Then the layers 160.3, 160.4 were deposited. In other embodiments, all of the layers 160.$i$ ($i$=1, 2, . . . ) overlie the protrusions 140. Also, the layers 160.$i$ do not have to overlie each other. For example, layers 160.1, 160.2, 160.3 may all be exposed at the top surface of the structure.

Layer 160 of FIG. 31 may correspond to one or more of the layers 160, 1510, 170 in FIG. 17.

In FIG. 31, the top surface of layer 160 is not planar. Layer 160 has a protruding portion 170.1 over each feature 140. The protrusions 170.1 will be used to define the layer 160 in a self-aligned manner.

As shown in FIG. 31, cavities 170C form in layer 160 between protrusions 170.1. These cavities are filled with some layer 1710. In one embodiment, layer 1710 is silicon dioxide deposited on layer 160 and planarized by CMP or some other process. The structure has a planar top surface, with layer 160 exposed. In other embodiments, layer 1710 is photoresist, polyimide, or some other material. A non-planar top surface is also possible.

Figure 32:
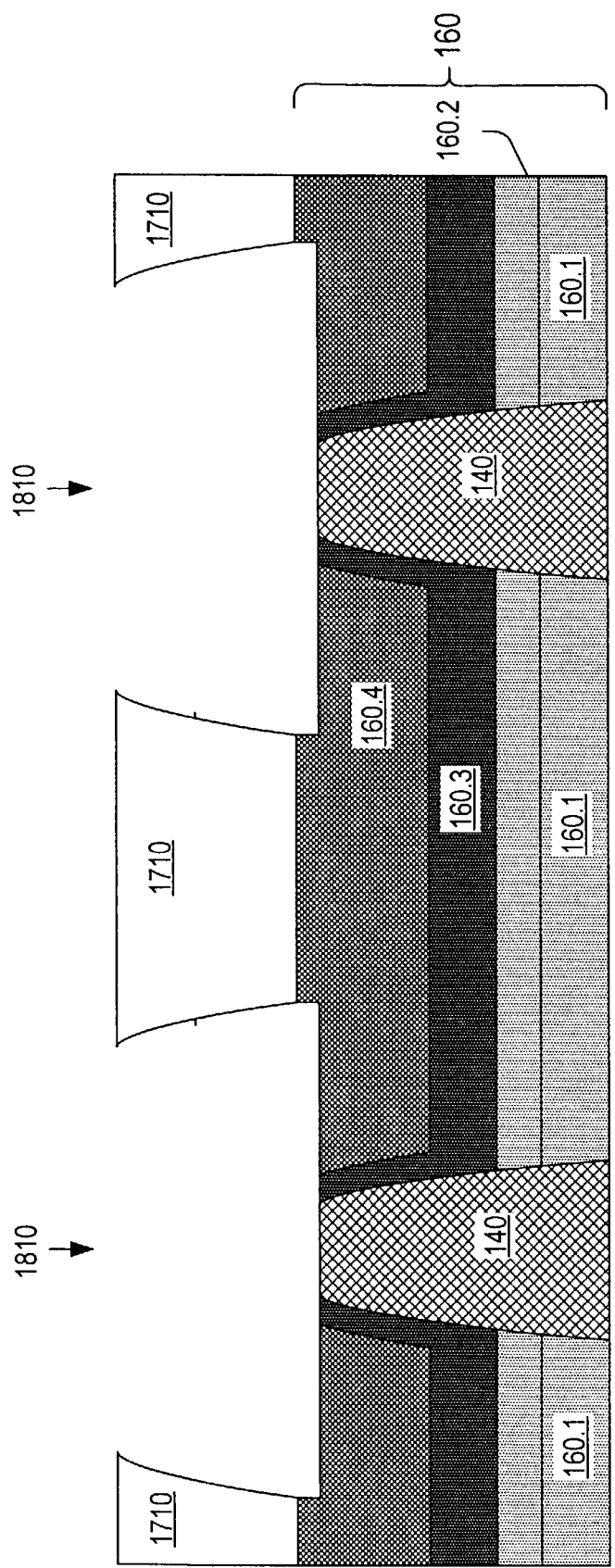

Layer 160 is etched selectively to layer 1710. See FIG. 32. No mask is needed. This etch creates cavities 1810 over the protrusions 140. Each cavity 1810 extends to the left and right of the respective protrusion 140. In FIG. 32, the etch terminates when the protrusions 140 become exposed. This is not necessary, however. The etch may terminate earlier, before the layer 160.3 is etched off the features 140. In other embodiments, the etch continues after the exposure of features 140, and the features 140 may or may not be attacked by the etch. In FIG. 32, the top surface of layer 160 is not planar after the etch. In other embodiments, the top surface of layer 160 is planar after the etch.

Figure 33:
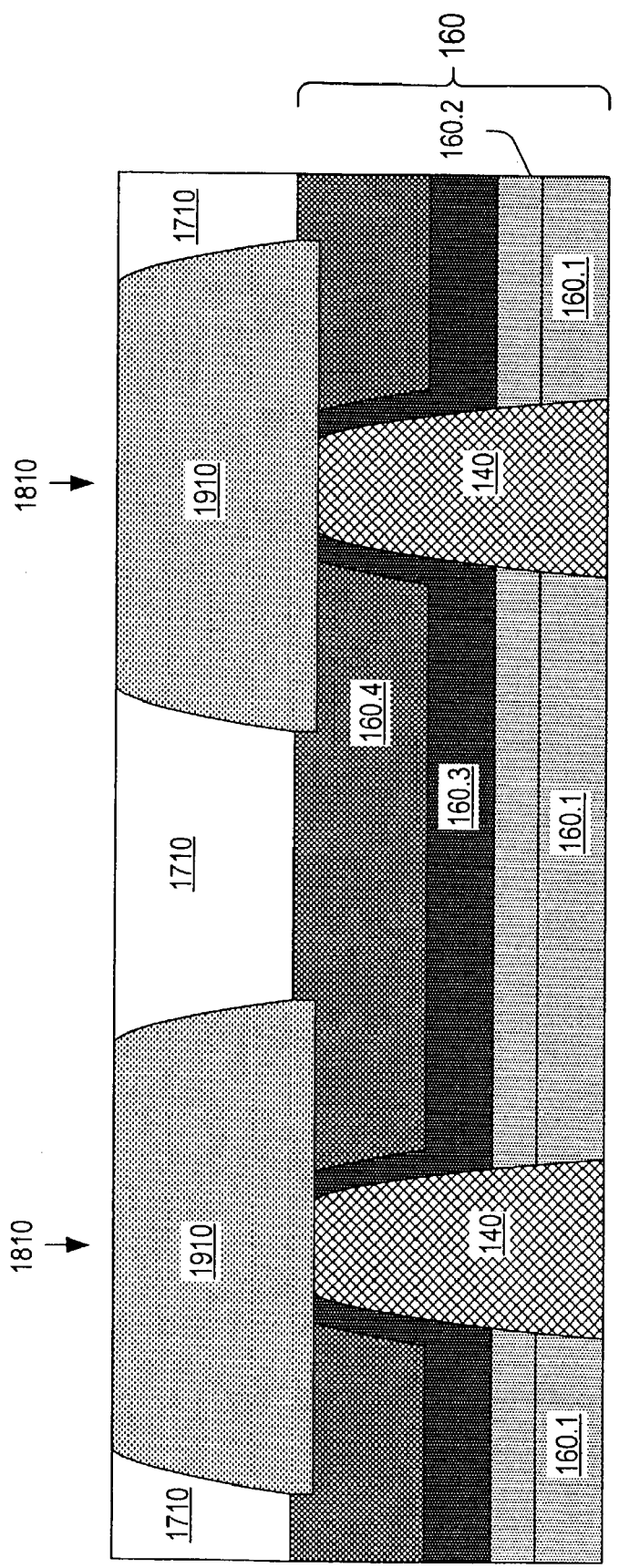

A protective layer 1910 (FIG. 33) is formed in cavities 1810 to protect the layer 160 near protrusions 140. Layer 1910 can be polyimide, photoresist, silicon nitride (as in FIG. 19), or any other suitable material. Layer 1910 may fill the cavities 1810 completely or partially (see FIG. 19). Layer 1910 may protrude upward from cavities 1810.

Figure 34:
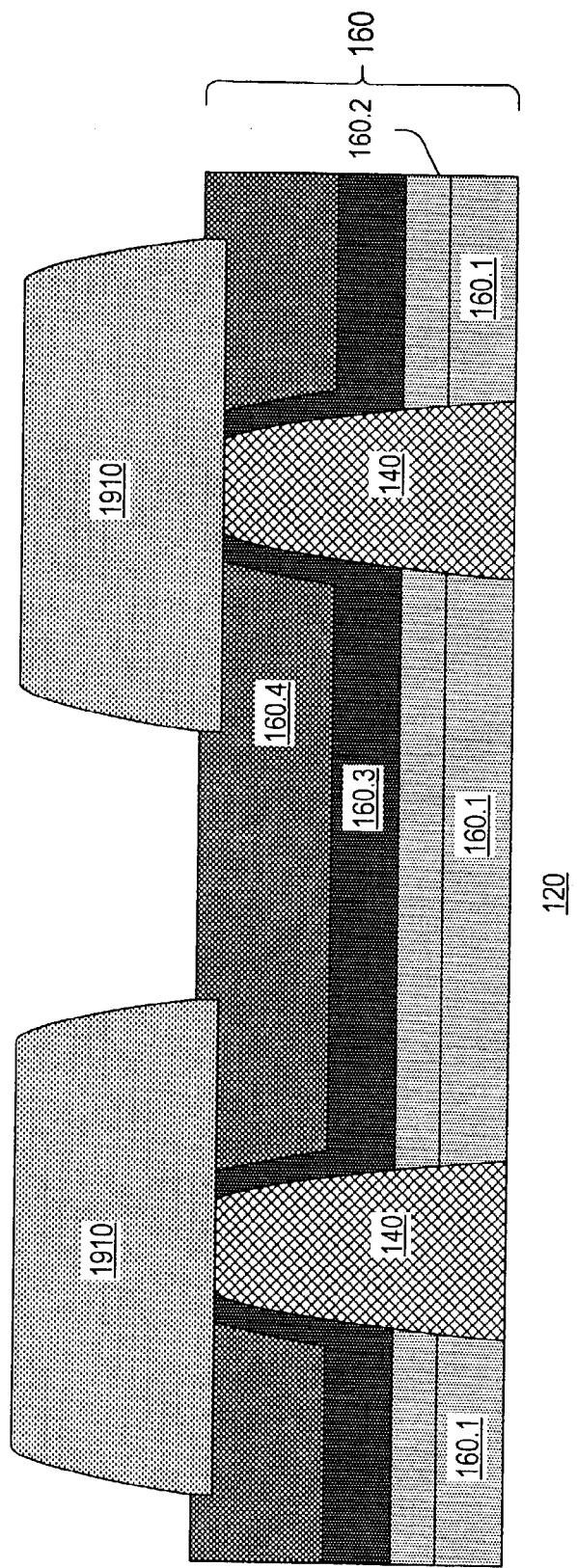

Layer 1710 is removed by a blanket etch selective to layer 1910. The resulting structure is shown in FIG. 34.

Figure 35:
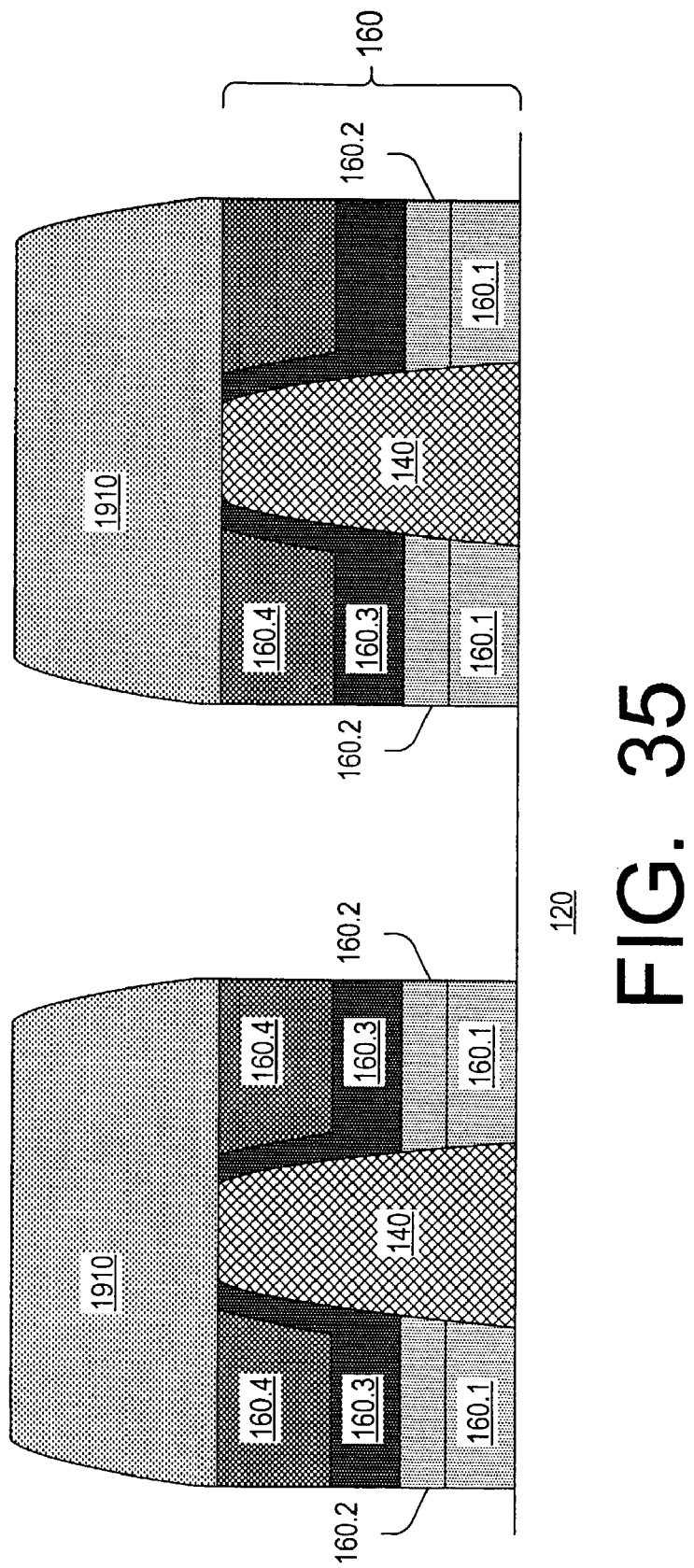
Figure 36:
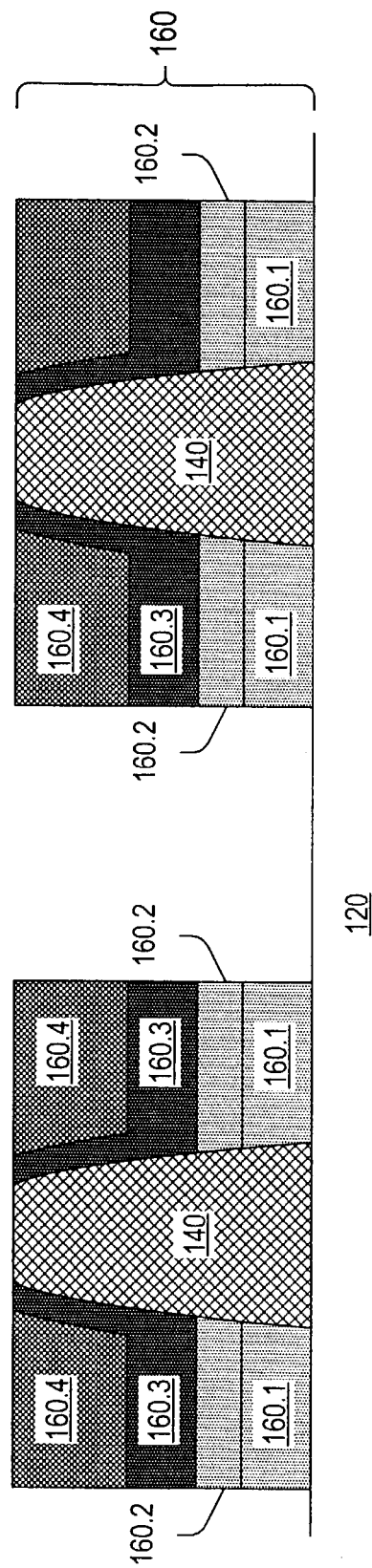

Layer 160 is etched with layer 1910 as a mask. The resulting structure is shown in FIG. 35. Self-aligned features are formed around protrusions 140. Each self-aligned feature includes portions of layers 160.1–160.4.

The subsequent processing may include removal of layer 1910. Also, the layers 160.1–160.4 may be removed from one side of each protrusion 140 using a mask. The alignment of this mask is not critical because the edges of the mask openings can be positioned anywhere over the respective protrusions 140 (cf. mask 2020 in FIG. 20). Alternatively, the removal of layers 160.1–160.4 from one side of each protrusion can be performed before the complete removal of layer 1710, as in FIG. 20. The processing depends on the particular requirements. In some embodiments, the layers 160.1–160.4 are left on all the side around protrusions 140.

The invention is not limited to any particular processing steps, materials, or other particulars. Other embodiments and variations are within the scope of the invention, as defined by the appended claims.

The invention claimed is:

1. A method for fabricating an integrated circuit, the method comprising:
   (a) forming a structure comprising a semiconductor substrate, the structure comprising a first upward protruding feature;
   (b) forming a first layer on the structure, the first layer having a first portion protruding upward over the first feature;
   (c) forming a second layer over the first layer such that the first portion is exposed and not completely covered by the second layer;
   (d) partially removing the first layer selectively to the second layer to form a cavity at the location of the first feature;
   (e) forming a third layer in the cavity; and
   (f) removing at least parts of the second layer and the first layer selectively to the third layer.

2. The method of claim 1 wherein the first layer comprises a plurality of sub-layers, and at least two sub-layers are made from different materials.

3. The method of claim 2 wherein the first portion comprises a portion of at least one sub-layer of the first layer, but the first portion does not comprise a portion of each sub-layer of the first layer.

4. The method of claim 2 wherein at least the bottom sub-layer of the first layer does not overlie the first feature, but at least the top sub-layer of the first layer overlies the first feature.

5. The method of claim 4 wherein the removing operation that removes the parts of the second and first layers does not completely remove any of the sub-layers of the first layer, each sub-layer having a portion covered by the third layer and remaining in the integrated circuit.

6. The method of claim 1 wherein forming the first layer comprises:
   forming a first sub-layer of the first layer, and removing a portion of the first sub-layer over said feature; and then
   forming a second sub-layer over the first sub-layer and over said feature.

7. The method of claim 6 wherein the second sub-layer comprises a layer L1 and a layer L2 overlying the layer L1; and
   the partial removing of the first layer comprises partial removing of the layer L2 but not of the layer L1.

* * * * *